US012626765B2

(12) United States Patent
Park et al.

(10) Patent No.:  US 12,626,765 B2
(45) Date of Patent:  May 12, 2026

(54) NONVOLATILE MEMORY DEVICES AND METHODS OF CONTROLLING WORDLINE ERASE OPERATIONS WITHIN SUB-BLOCKS OF MEMORY STRINGS

(71) Applicant: Samsung Electronics Co., Ltd., Suwon-si (KR)

(72) Inventors: Sangwon Park, Suwon-si (KR); Jooyong Park, Suwon-si (KR); Jaeha Park, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 128 days.

(21) Appl. No.: 18/512,279

(22) Filed: Nov. 17, 2023

(65) Prior Publication Data

US 2024/0420772 A1     Dec. 19, 2024

(30) Foreign Application Priority Data

Jun. 13, 2023     (KR) ........................ 10-2023-0075261

(51) Int. Cl.
| | |
|---|---|
| *G11C 16/10* | (2006.01) |
| *G11C 11/56* | (2006.01) |
| *G11C 13/00* | (2006.01) |
| *G11C 16/04* | (2006.01) |
| *G11C 16/08* | (2006.01) |

(Continued)

(52) U.S. Cl.
CPC ........ G11C 16/107 (2013.01); G11C 11/5635 (2013.01); G11C 13/0097 (2013.01); G11C 16/0483 (2013.01); G11C 16/08 (2013.01);

G11C 16/16 (2013.01); G11C 16/3445 (2013.01); G11C 2211/5648 (2013.01)

(58) Field of Classification Search
CPC .............. G11C 16/107; G11C 11/5635; G11C 13/0097; G11C 16/0483; G11C 16/08; G11C 16/16; G11C 16/3445; G11C 2211/5648; G11C 16/30
See application file for complete search history.

(56) References Cited

U.S. PATENT DOCUMENTS

| | | |
|---|---|---|
| 8,369,158 B2 | 2/2013 | Goda et al. |
| 8,599,617 B2 | 12/2013 | Shiino et al. |

(Continued)

FOREIGN PATENT DOCUMENTS

| | | |
|---|---|---|
| CN | 102110474 A | 6/2011 |

*Primary Examiner* — Donald HB Braswell
(74) *Attorney, Agent, or Firm* — Wolf, Greenfield & Sacks, P.C.

(57)  ABSTRACT

A nonvolatile memory device may include at least one memory block and a control circuit. The at least one memory block includes a plurality of cell strings that are divided into a plurality of sub-blocks arranged in the vertical direction, and each of the sub-blocks includes boundary word-lines adjacent to another sub-block and internal word-lines different from the boundary word-lines. The control circuit may be configured to control an erase operation by applying a pre-program voltage with a first individual bias condition sequentially to the internal word-lines and the at least one boundary word-line of at least one sub-block to be erased from among the plurality of sub-blocks during a pre-program period of an erase loop, and by applying an erase voltage to a channel of the at least one memory block during an erase execution period of the erase loop.

20 Claims, 28 Drawing Sheets

(51) Int. Cl.
　　 *G11C 16/16* 　　　　(2006.01)
　　 *G11C 16/34* 　　　　(2006.01)

(56) References Cited

U.S. PATENT DOCUMENTS

| | | | | |
|---|---|---|---|---|
| 8,964,481 | B2 | 2/2015 | Oh et al. | |
| 9,916,900 | B2 | 3/2018 | Kim et al. | |
| 2017/0169883 | A1* | 6/2017 | Kwon | G11C 16/28 |
| 2022/0215886 | A1* | 7/2022 | Lim | G11C 16/28 |
| 2022/0284970 | A1* | 9/2022 | Mun | G11C 11/5635 |
| 2024/0404605 | A1* | 12/2024 | Payak | G11C 16/0483 |

\* cited by examiner

FIG. 1

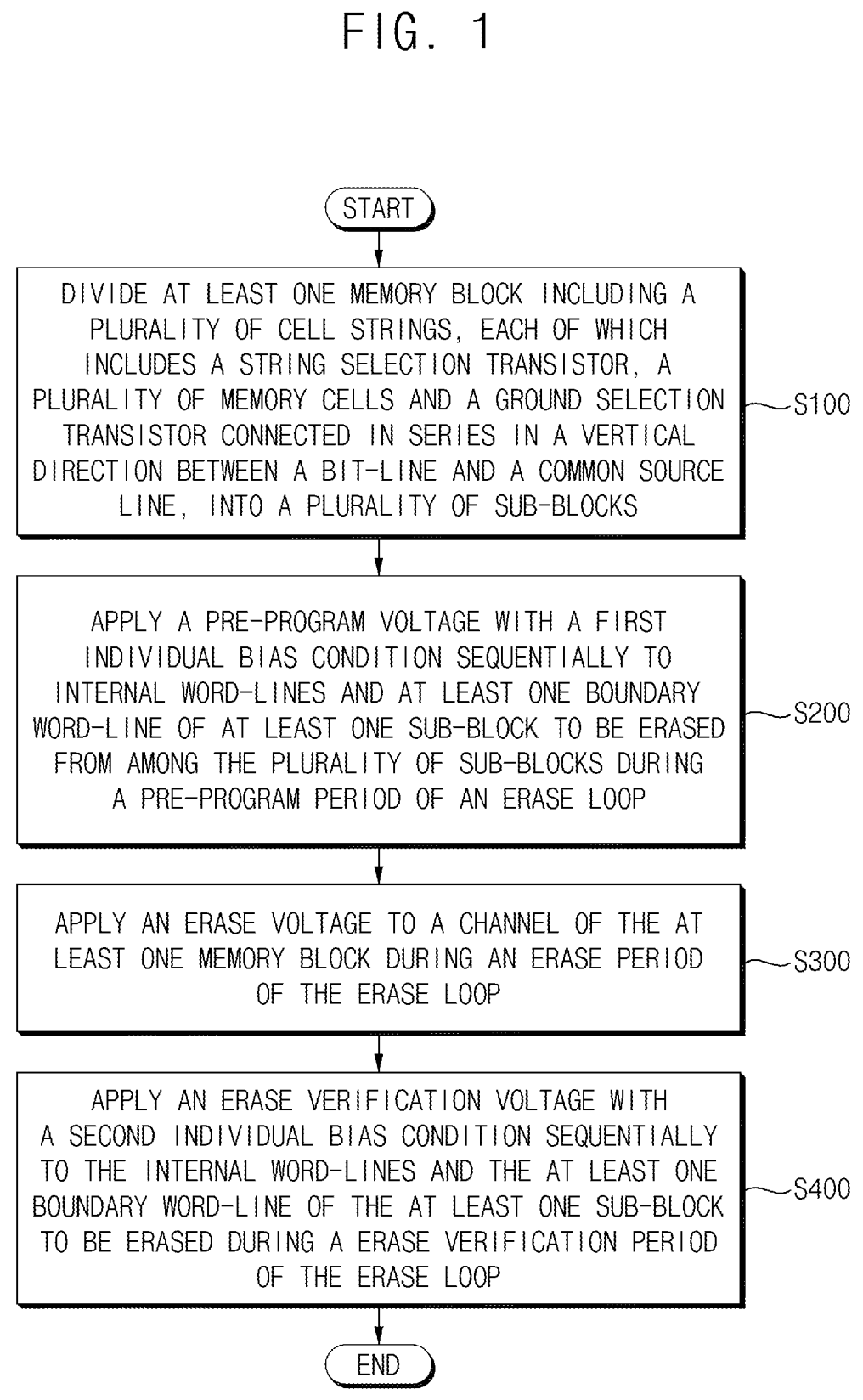

START

DIVIDE AT LEAST ONE MEMORY BLOCK INCLUDING A PLURALITY OF CELL STRINGS, EACH OF WHICH INCLUDES A STRING SELECTION TRANSISTOR, A PLURALITY OF MEMORY CELLS AND A GROUND SELECTION TRANSISTOR CONNECTED IN SERIES IN A VERTICAL DIRECTION BETWEEN A BIT-LINE AND A COMMON SOURCE LINE, INTO A PLURALITY OF SUB-BLOCKS ~S100

APPLY A PRE-PROGRAM VOLTAGE WITH A FIRST INDIVIDUAL BIAS CONDITION SEQUENTIALLY TO INTERNAL WORD-LINES AND AT LEAST ONE BOUNDARY WORD-LINE OF AT LEAST ONE SUB-BLOCK TO BE ERASED FROM AMONG THE PLURALITY OF SUB-BLOCKS DURING A PRE-PROGRAM PERIOD OF AN ERASE LOOP ~S200

APPLY AN ERASE VOLTAGE TO A CHANNEL OF THE AT LEAST ONE MEMORY BLOCK DURING AN ERASE PERIOD OF THE ERASE LOOP ~S300

APPLY AN ERASE VERIFICATION VOLTAGE WITH A SECOND INDIVIDUAL BIAS CONDITION SEQUENTIALLY TO THE INTERNAL WORD-LINES AND THE AT LEAST ONE BOUNDARY WORD-LINE OF THE AT LEAST ONE SUB-BLOCK TO BE ERASED DURING A ERASE VERIFICATION PERIOD OF THE ERASE LOOP ~S400

END

Figures 2, 3:
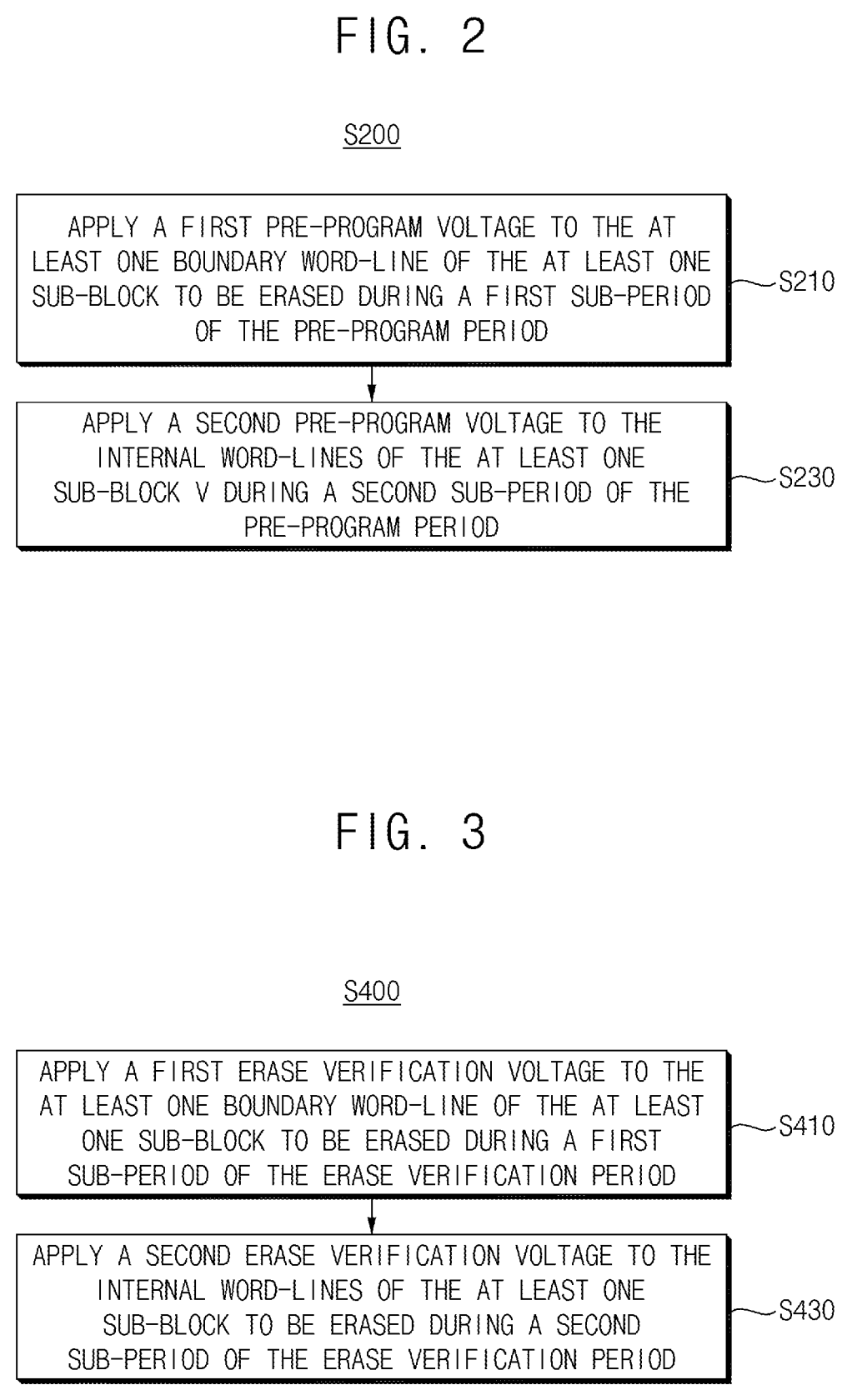

APPLY A FIRST PRE-PROGRAM VOLTAGE TO THE AT
LEAST ONE BOUNDARY WORD-LINE OF THE AT LEAST ONE
SUB-BLOCK TO BE ERASED DURING A FIRST SUB-PERIOD
OF THE PRE-PROGRAM PERIOD                           ~S210

APPLY A SECOND PRE-PROGRAM VOLTAGE TO THE
INTERNAL WORD-LINES OF THE AT LEAST ONE
SUB-BLOCK V DURING A SECOND SUB-PERIOD OF THE
PRE-PROGRAM PERIOD                                  ~S230

APPLY A FIRST ERASE VERIFICATION VOLTAGE TO THE
AT LEAST ONE BOUNDARY WORD-LINE OF THE AT LEAST
ONE SUB-BLOCK TO BE ERASED DURING A FIRST
SUB-PERIOD OF THE ERASE VERIFICATION PERIOD        ~S410

APPLY A SECOND ERASE VERIFICATION VOLTAGE TO THE
INTERNAL WORD-LINES OF THE AT LEAST ONE
SUB-BLOCK TO BE ERASED DURING A SECOND
SUB-PERIOD OF THE ERASE VERIFICATION PERIOD        ~S430

MEMORY CONTROLLER

NONVOLATILE MEMORY DEVICE

CTRL

CMD

ADDR

DATA

PWR

CTLs {

CTL1 → HV GENERATOR
510

→ VPGM
→ VPPASS
→ VVPASS } VPASS
→ VRPASS
→ VPPGM
→ VERS

CTL2 → LV GENERATOR
520

→ VPV
→ VRD
→ VEV1,VEV2

CTL3 → NV GENERATOR
530

→ VNEG1

→ VNEG2

BLKi_b

NONVOLATILE MEMORY DEVICES AND METHODS OF CONTROLLING WORDLINE ERASE OPERATIONS WITHIN SUB-BLOCKS OF MEMORY STRINGS

CROSS-REFERENCE TO RELATED APPLICATION

This US application claims priority under 35 USC § 119 to Korean Patent Application No. 10-2023-0075261, filed on Jun. 13, 2023, in the Korean Intellectual Property Office (KIPO), and the entire contents of the above-identified application are incorporated by reference herein.

BACKGROUND

1. Technical Field

Aspects of the present disclosure generally relate to semiconductor memory devices, and more particularly to nonvolatile memory devices and to methods of controlling erase operations of nonvolatile memory devices.

2. Discussion of the Related Art

Semiconductor memory devices for storing data may be classified into volatile memory devices and nonvolatile memory devices. Volatile memory devices, such as dynamic random access memory (DRAM) devices, are typically configured to store data by charging or discharging capacitors in memory cells, and lose the stored data when power is turned off or disconnected therefrom. Nonvolatile memory devices, such as flash memory devices, may maintain stored data even when power is turned off or disconnected. Volatile memory devices are widely used as main memories of various apparatuses, while nonvolatile memory devices are widely used for storing program codes and/or data in various electronic devices, such as computers, mobile devices, etc.

Recently, nonvolatile memory devices of three-dimensional structure such as a vertical NAND memory devices have been developed to increase integration degree and memory capacity of the nonvolatile memory devices. Along with increases in the integration degree and memory capacity, characteristics of word-lines (e.g., boundary word-lines) may be degraded when an erase operation of the nonvolatile memory device is performed.

SUMMARY

Some example embodiments may provide nonvolatile memory devices capable of enhancing a characteristic of boundary word-lines.

Some example embodiments may provide methods of controlling erase operations of nonvolatile memory devices, capable of enhancing a characteristic of a boundary word-line.

According to some example embodiments, a nonvolatile memory device is provided, where the nonvolatile memory device may include at least one memory block and a control circuit. The at least one memory block may include a plurality of cell strings, where each of the plurality of cell strings includes a string selection transistor, a plurality of memory cells, and a ground selection transistor which are connected in series and arranged in a vertical direction between a bit-line and a common source line. The at least one memory block may be divided into a plurality of sub-blocks that may be arranged in the vertical direction. Each of the plurality of sub-blocks includes at least one boundary word-line adjacent to another sub-block of the plurality of sub-blocks, and internal word-lines different from at least one boundary word-line. The control circuit may be configured to control an erase operation by applying a pre-program voltage with a first individual bias condition sequentially to the internal word-lines and the at least one boundary word-line of at least one sub-block to be erased from among the plurality of sub-blocks during a pre-program period of an erase loop, and by applying an erase voltage to a channel of the at least one memory block during an erase execution period of the erase loop.

According to some example embodiments, a method of controlling an erase operation of a nonvolatile memory device is provided. According to the method, at least one memory block including a plurality of cell strings may be divided into a plurality of sub-blocks arranged in a vertical direction, where each of the plurality of cell strings includes a string selection transistor, a plurality of memory cells and a ground selection transistor which are connected in series and arranged in the vertical direction between a bit-line and a common source line. Each of the plurality of sub-blocks may include at least one boundary word-line adjacent to another sub-block of the plurality of sub-blocks, and internal word-lines different from at least one boundary word-line. A pre-program voltage with a first individual bias condition may be sequentially applied to the internal word-lines and the at least one boundary word-line of at least one sub-block to be erased from among the plurality of sub-blocks during a pre-program period of an erase loop, and an erase voltage may be applied to a channel of the at least one memory block during an erase execution period of the erase loop.

According to some example embodiments, a nonvolatile memory device may be provided, where the nonvolatile memory device may include at least one memory block and a control circuit. The at least one memory block may include a plurality of cell strings, where each of the plurality of cell strings includes a string selection transistor, a plurality of memory cells and a ground selection transistor which are connected in series and arranged in a vertical direction between a bit-line and a common source line. The at least one memory block may be divided into a plurality of sub-blocks arranged in the vertical direction, and each of the plurality of sub-blocks may include at least one boundary word-line adjacent to another sub-block of the plurality of sub-blocks, and internal word-lines different from the at least one boundary word-line. The control circuit may be configured to control an erase operation by applying a pre-program voltage to word-lines of at least one sub-block to be erased from among the plurality of sub-blocks during a pre-program period of an erase loop, by applying an erase voltage to a channel of the at least one memory block during an erase execution period of the erase loop and by applying an erase verification voltage to at least one boundary word-line of the at least one sub-block to be erased during an erase verification period of the erase loop.

Accordingly, a pre-program operation with a first bias condition may be performed on memory cells coupled to internal word-lines and boundary word-lines of at least one sub-block to be erased and/or an erase verification operation with a second bias condition may be performed on the memory cells coupled to internal word-lines and the boundary word-lines of the at least one sub-block to be erased, and thus deep erase and/or soft erase occurring to the memory cells coupled to the boundary word-lines may be prevented. Accordingly, the characteristic of the memory cells coupled to the boundary word-lines may be prevented from being degraded.

BRIEF DESCRIPTION OF THE DRAWINGS

Illustrative, non-limiting examples of embodiments will be more clearly understood from the following detailed description in conjunction with the accompanying drawings.

FIG. 1 is a flow chart illustrating a method of controlling an erase operation of a nonvolatile memory device according to example embodiments.

FIG. 2 is a flow chart illustrating an operation of applying the pre-program voltage with the first individual bias condition in FIG. 1 according to example embodiments.

FIG. 3 is a flow chart illustrating an operation of applying the erase verification voltage with the second individual bias condition in FIG. 1 according to example embodiments.

FIG. 5 is a block diagram illustrating a storage device according to example embodiments.

FIG. 6 is a graph showing a memory cell distribution change obtained through repetitive erase operations.

FIG. 7 is a graph showing a memory cell distribution obtained by sequentially performing pre-program operation and an erase operation individually.

FIG. 8 is a block diagram illustrating an example of the nonvolatile memory device in the storage device of FIG. 5 according to example embodiments.

4

Figure 23A:
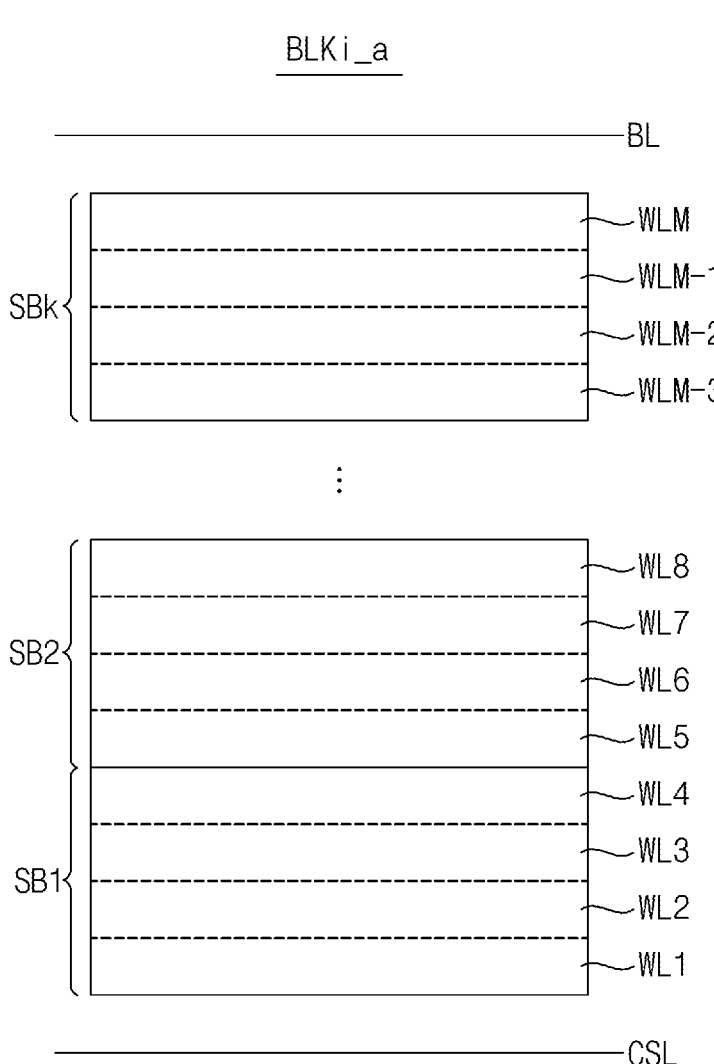
Figure 23B:
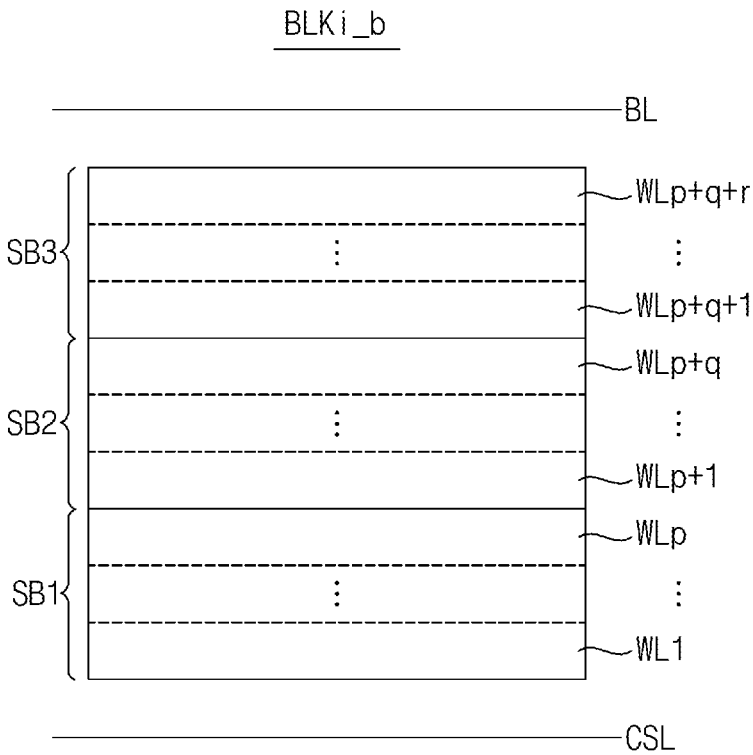

FIGS. 23A and 23B are diagrams of examples of sub-blocks included in a memory block on which an erase operation is performed, according to example embodiments.

Figure 24:
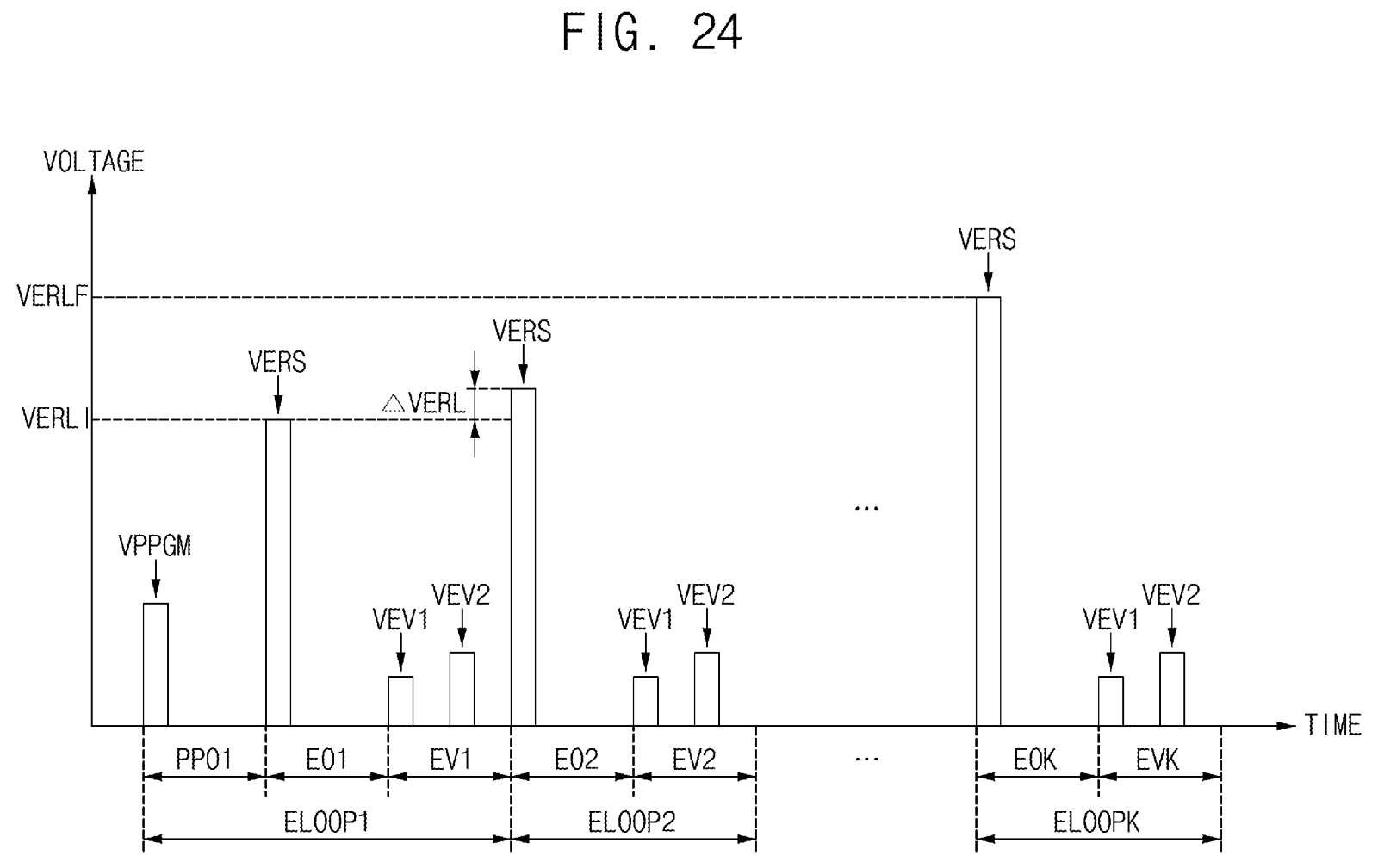

FIG. 24 illustrates an example of a plurality of erase loops performed on at least one sub-block to be erased according to example embodiments.

Figure 25:
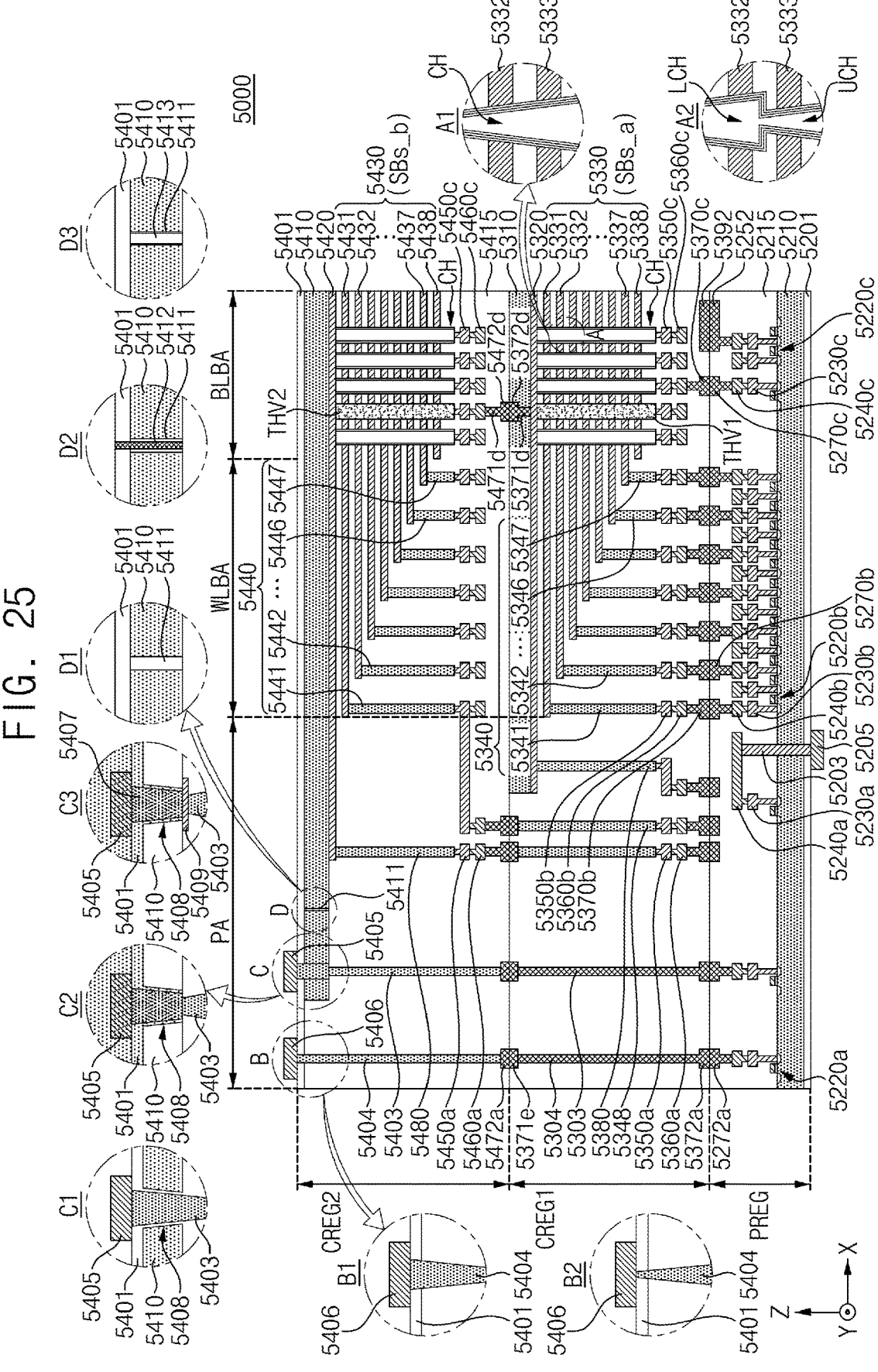

FIG. 25 is a cross-sectional view of a nonvolatile memory device according to some example embodiments.

Figure 26:
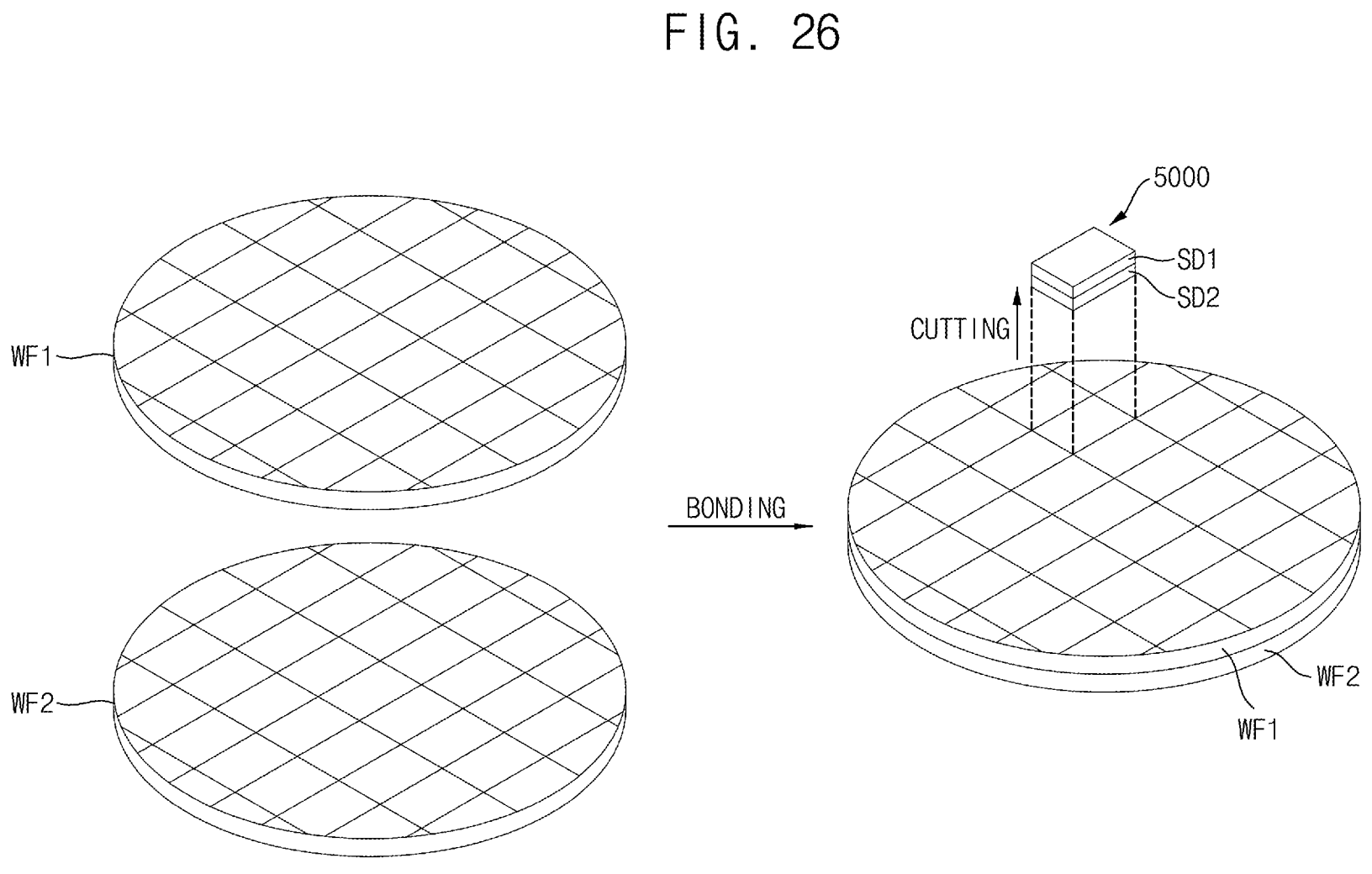

FIG. 26 is a diagram illustrating a manufacturing process of a stacked semiconductor device according to some example embodiments.

Figure 27:
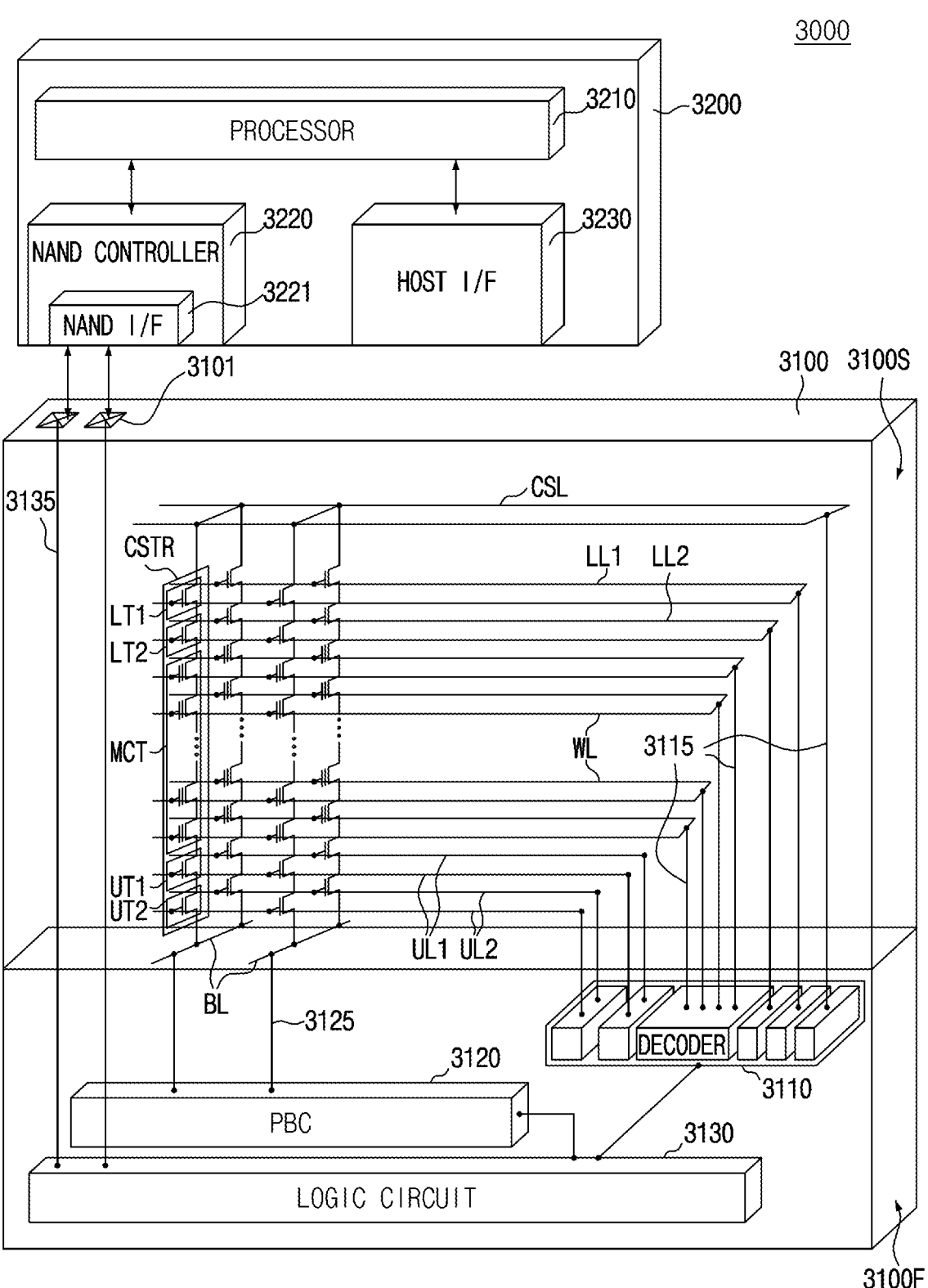

FIG. 27 is a block diagram illustrating an electronic system including a semiconductor device according to some example embodiments.

DETAILED DESCRIPTION OF THE EMBODIMENTS

Various examples of embodiments will be described more fully hereinafter with reference to the accompanying drawings, in which some example embodiments are shown.

FIG. 1 is a flow chart illustrating a method of controlling an erase operation of a nonvolatile memory device according to example embodiments.

FIG. 1 illustrates a method of controlling an erase operation of a nonvolatile memory device including at least one memory block which includes a plurality of cell strings. Each cell string may include a string selection transistor, a plurality of memory cells, and a ground selection transistor connected in series in a vertical direction between a bit-line and a common source line. According to some example embodiments, the nonvolatile memory device may include a three-dimensional NAND flash memory device or a vertical NAND flash memory device.

Referring to FIG. 1, the at least one memory block which includes the plurality of cell strings may be divided into a plurality of sub-blocks in the vertical direction (operation S100). Each of the plurality of sub-blocks may be smaller than a physical block of the nonvolatile memory device. Each of the plurality of sub-blocks may include at least one boundary word-line adjacent to another sub-block and internal word-lines different from or other than the at least one boundary word-line.

A pre-program voltage with a first individual bias condition may be sequentially applied to the internal word-lines and the at least one boundary word-line of at least one sub-block to be erased from among the plurality of sub-blocks during a pre-program period of an erase loop (operation S200).

When a memory block of the nonvolatile memory device is divided into a plurality of sub-blocks and an erase operation is performed by unit of a sub-block, a characteristic of the boundary word-line of the sub-block may be degraded, in part because memory cells coupled to the boundary word-line of a sub-block to be erased may be deeply erased and memory cells coupled to the boundary word-line of a sub-block not to be erased may be softly erased as the erase operation is repeated. When the characteristic of the boundary word-lines of the sub-block is degraded, a characteristic of the internal word-lines of the sub-block may be degraded. For preventing the characteristic of the boundary word-lines of the sub-block from being degraded, a pre-program voltage with the first individual bias condition may be sequentially applied to the internal word-lines and the at least one boundary word-line of at least one sub-block to be erased from among the plurality of sub-blocks during the pre-program period such that threshold voltages of the memory cells coupled to each of the internal word-lines and the at least one boundary word-line of the at least one sub-block to be erased are shifted in advance. Therefore, deep erase and/or soft erase may be prevented when an erase voltage is applied.

An erase voltage may be applied to a channel of the at least one memory block during an erase period of the erase loop (operation S300). That is, the erase voltage is applied to a channel of the at least one sub-block to be erased and the at least one sub-block not to be erased.

In some example embodiments, an erase verification voltage with a second individual bias condition may be sequentially applied to the internal word-lines and the at least one boundary word-line of the at least one sub-block to be erased during a verification period of the erase loop successive to the erase execution period (operation S400).

When the erase verification voltage is applied to the at least one boundary word-line of the at least one sub-block to be erased in addition to the internal word-lines of the at least one sub-block to be erased, erased state of memory cells coupled to the at least one boundary word-line may be verified and a level of a pre-program voltage to be applied to the at least one boundary word-line of the at least one sub-block to be erased in a next erase loop may be determined based on a result of the verification.

FIG. 2 is a flow chart illustrating an operation of applying the pre-program voltage with the first individual bias condition in FIG. 1 according to some example embodiments.

Referring to FIG. 2, for applying the pre-program voltage with the first individual bias condition to each of the internal word-lines and the at least one boundary word-line (operation S200), a first pre-program voltage may be applied to the internal word-lines of the at least one sub-block to be erased during a first sub-period of the pre-program period (operation S210), and a second pre-program voltage may be applied to the at least one boundary word-line of the at least one sub-block to be erased during a second sub-period of the pre-program period (operation S230).

In some example embodiments, a time interval of the second sub-period may be different from a time interval of the first sub-period and the second pre-program voltage may have a voltage level that is different from a voltage level of the first pre-program voltage.

FIG. 3 is a flow chart illustrating an operation of applying the erase verification voltage with the second individual bias condition in FIG. 1 according to some example embodiments.

Referring to FIG. 3, for applying the erase verification voltage with the second individual bias condition to each of the internal word-lines and the at least one boundary word-line (operation S400), a first erase verification voltage may be applied to the at least one boundary word-line of the at least one sub-block to be erased during a first sub-period of the erase verification period (operation S410) and a second erase verification voltage may be applied to the internal word-lines of the at least one sub-block to be erased during a second sub-period of the erase verification period (operation S430).

In some example embodiments, a time interval of the second sub-period may be different from a time interval of the first sub-period and the second erase verification voltage may have a voltage level that is different from a voltage level of the first erase verification voltage. For example, the time interval of the second sub-period may be greater than the time interval of the first sub-period and the voltage level of the second erase verification voltage may be greater than the voltage level of the first erase verification voltage.

Figure 4:
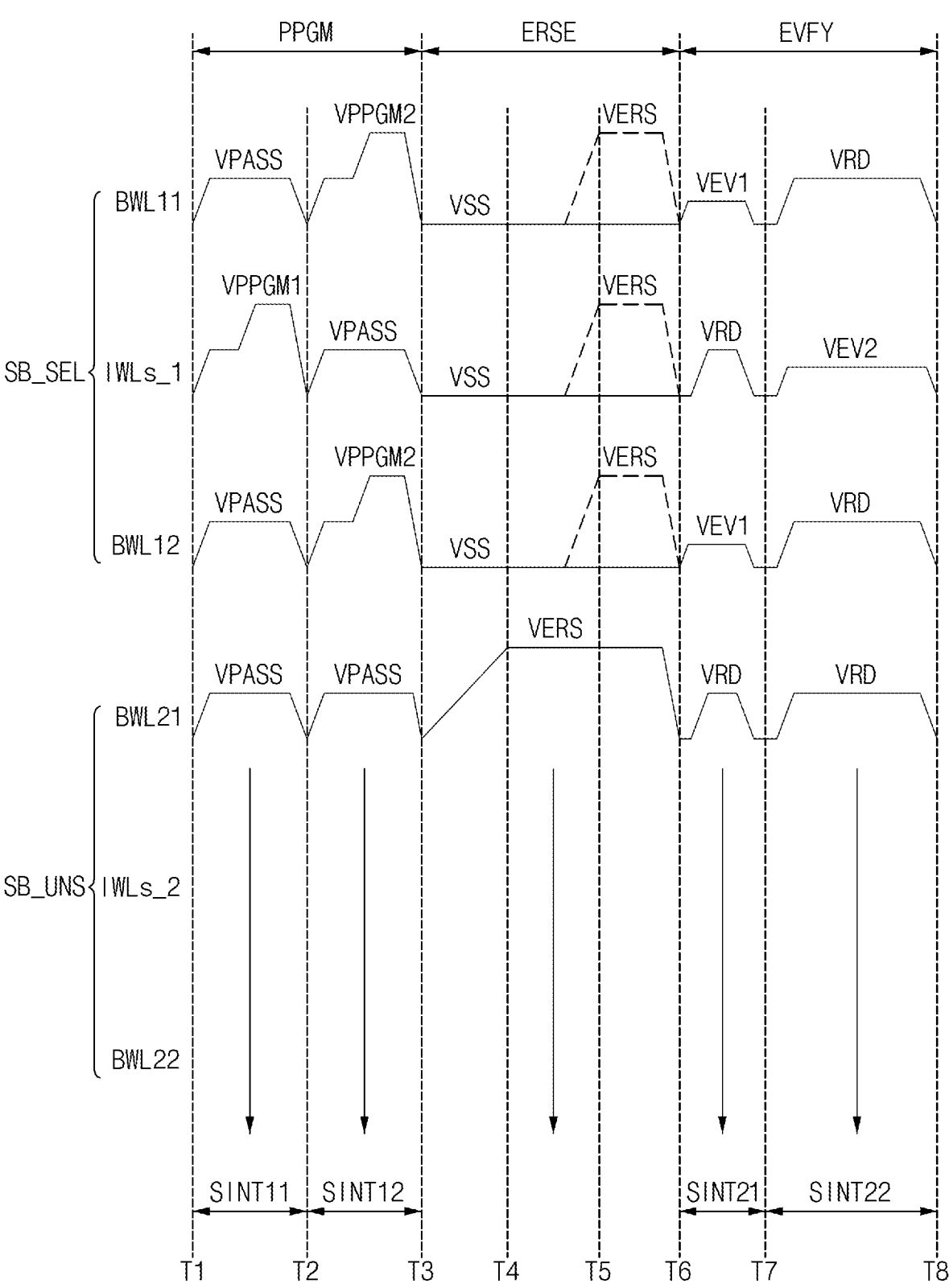
FIG. 4 is a timing diagram illustrating a method of controlling an erase operation of a nonvolatile memory device according to example embodiments.

FIG. 4 is a timing diagram illustrating a method of controlling an erase operation of a nonvolatile memory device according to some example embodiments.

FIG. 4 illustrates a pre-program period PPGM, an erase execution period ERSE and an erase verification period EVFY of one of a plurality of erase loops. Time points T1, T3, T6 and T8 represent boundaries of the periods. A time point T2 represents a boundary of a first sub-period SINT11 and a second sub-period SINT12 of the pre-program period PPGM, and a time point T7 represents a boundary of a first sub-period SINT21 and a second sub-period SINT22 of the erase verification period EVFY.

Referring to FIG. 4, during the first sub-period SINT11 of the pre-program period PPGM, a first pre-program voltage VPPGM1 may be applied to internal word-lines IWLs_1 of a selected sub-block SB_SEL (that is, a sub-block to be erased or an erase-target sub-block), a pass voltage VPASS may be applied to boundary word-lines BWL11 and BWL12 of the selected sub-block SB_SEL, and the pass voltage VPASS may be applied to internal word-lines IWLs_2 and to boundary word-lines BWL21 and BWL22 of an unselected sub-block SB_UNS (that is, a sub-block not to be erased or an erase-non-target sub-block). Therefore, memory cells coupled to the internal word-lines IWLs_1 of the selected sub-block SB_SEL may be pre-programmed.

During the second sub-period SINT12 of the pre-program period PPGM, a second pre-program voltage VPPGM2 may be applied to the boundary word-lines BWL11 and BWL12 of the selected sub-block SB_SEL, the pass voltage VPASS may be applied to the internal word-lines IWLs_1 of the selected sub-block SB_SEL and the pass voltage VPASS may be applied to the internal word-lines IWLs_2 and to boundary word-lines BWL21 and BWL22 of the unselected sub-block SB_UNS. Therefore, memory cells coupled to the boundary word-lines BWL11 and BWL12 of the selected sub-block SB_SEL may be pre-programmed.

In some example embodiments, a time interval of the second sub-period SINT12 may be different from a time interval of the first sub-period SINT11, and a voltage level of the second pre-program voltage VPPGM2 may be different from a voltage level of the first pre-program voltage VPPGM1.

The time interval of each of the first sub-period SINT11 and the second sub-period SINT12 and/or the voltage level of each of the pre-program voltage VPPGM1 and the second pre-program voltage VPPGM2 may correspond to the first bias condition.

During the erase execution period ERSE between the time points T3 and T6, an erase voltage VERS may be applied to a channel of the selected sub-block SB_SEL and the unselected sub-block SB_UNS. The erase voltage VERS may begin to ramp at the time point T3 and may arrive at a target level at a time point T4. During the erase execution period ERSE, the internal word-lines IWLs_2 and the boundary word-lines BWL21 and BWL22 of the unselected sub-block SB_UNS are floated and the internal word-lines IWLs_2 and the boundary word-lines BWL21 and BWL22 of the unselected sub-block SB_UNS are coupled to the erase voltage VERS.

During the erase execution period ERSE, the memory cells coupled to the to the boundary word-lines BWL11 and BWL12 and the internal word-lines IWLs_1 of the selected sub-block SB_SEL may be erased by applying a word-line erase voltage VSS to the boundary word-lines BWL11 and BWL12 and the internal word-lines IWLs_1 of the selected sub-block SB_SEL, or by floating the boundary word-lines BWL11 and BWL12 and the internal word-lines IWLs_1 of the selected sub-block SB_SEL from a time point T5.

During the first sub-period SINT21 of the erase verification period VEFY, a first erase verification voltage VEV1 may be applied to the boundary word-lines BWL11 and BWL12 of the selected sub-block SB_SEL for verifying erased states of the memory cells coupled to the boundary word-lines BWL11 and BWL12, a read voltage VRD may be applied to the internal word-lines IWLs_1 of the selected sub-block SB_SEL, and the read voltage VRD is applied to the internal word-lines IWLs_2 and the boundary word-lines BWL21 and BWL22 of the unselected sub-block SB_UNS.

During the second sub-period SINT22 of the erase verification period VEFY, the read voltage VRD may be applied to the boundary word-lines BWL11 and BWL12 of the selected sub-block SB_SEL, a second erase verification voltage VEV2 may be applied to is applied to the internal word-lines IWLs_1 of the selected sub-block SB_SEL for verifying erased states of the memory cells coupled to the internal word-lines IWLs_1, and the read voltage VRD is applied to the Internal word-lines IWLs_2 and the boundary word-lines BWL21 and BWL22 of the unselected sub-block SB_UNS.

In some example embodiments, a time interval of the second sub-period SINT22 may be different from a time interval of the first sub-period SINT21, and a voltage level of the second erase verification voltage VEV2 may be different from a voltage level of the first erase verification voltage VEV1. For example, the time interval of the second sub-period SINT22 may be greater than the time interval of the first sub-period SINT21 and the voltage level of the second erase verification voltage VEV2 may be greater than the voltage level of the first erase verification voltage VEV1.

The time interval of each of the first sub-period SINT21 and the second sub-period SINT22 and/or the voltage level of each of the first erase verification voltage VEV1 and the second erase verification voltage VEV2 may correspond to the second bias condition.

Performing the erase operation by applying the erase voltage VERS may be performed by using a gate induced drain leakage (GIDL). As may be understood from the name itself, the GIDL indicates a phenomenon that a leakage occurs at a drain of a transistor by a gate of the transistor. For example, when 0V or a negative voltage level is applied to the gate and a sufficiently high positive voltage is applied to the drain, severe band bending may be induced in the oxide near the drain and thus band-to-band tunneling from the valence band of the silicon surface to the conduction band of the silicon body may occur.

The tunneling elections are attracted to the drain and the drain current increases. Usually the semiconductor substrate is biased by a ground voltage, and holes are attracted to the semiconductor substrate of a relatively low voltage. The gate voltage of a negative voltage level is used to turn off the transistor, but the transistor operates as if it is turned on because the drain current of the GIDL current increases due to the GIDL phenomenon. The GIDL current increases as the gate voltage is decreased and/or the drain voltage is increased.

The erase operation may be performed by using the GIDL phenomenon. For generating the GIDL phenomenon, a string selection transistor of a cell string, a ground selection transistor of a cell string, or a GIDL transistor may be used, which will be described with reference to FIGS. 13A through 13C.

Figure 5:
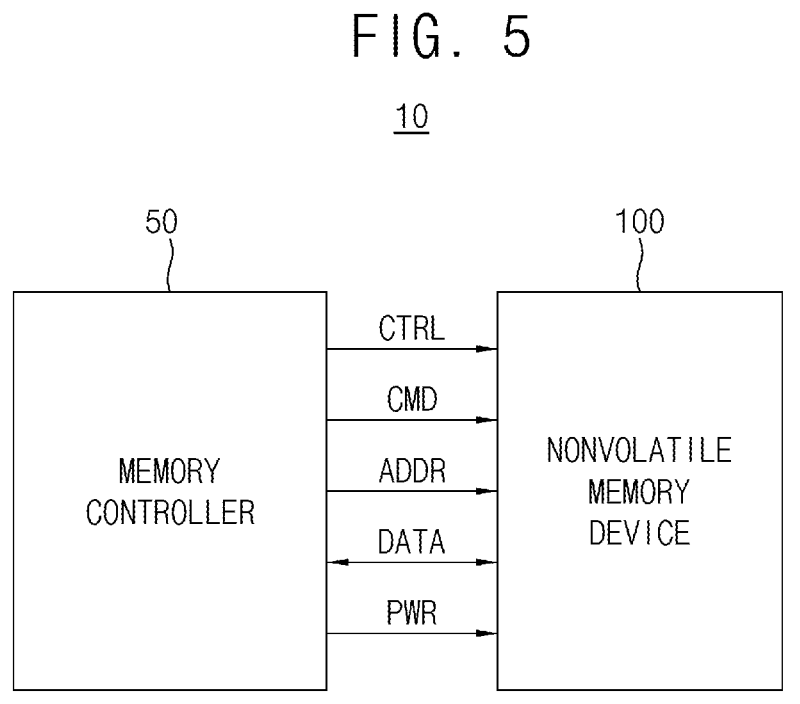

FIG. 5 is a block diagram illustrating a storage device according to some example embodiments.

Referring to FIG. 5, a storage device (i.e., a memory system) 10 may include a memory controller 50 and at least one nonvolatile memory device 100.

In some example embodiments, each of the memory controller 50 and the nonvolatile memory device 100 may be provided with the form of a chip, a package, or a module. Alternatively, the memory controller 50 and the nonvolatile memory device 100 may be packaged into one of various packages.

The nonvolatile memory device 100 may perform an erase operation, a program operation or a write operation under control of the memory controller 50. The nonvolatile memory device 100 may receive a command CMD, an address ADDR and data DATA through input/output lines from the memory controller 50 for performing such operations. In addition, the nonvolatile memory device 100 may receive a control signal CTRL through a control line from the memory controller 50. In addition, the nonvolatile memory device 100 receives a power PWR through a power line from the memory controller 50. The nonvolatile memory device 100 may transmit data DATA through the input/output lines to the memory controller 50 in some operations.

Figure 6:
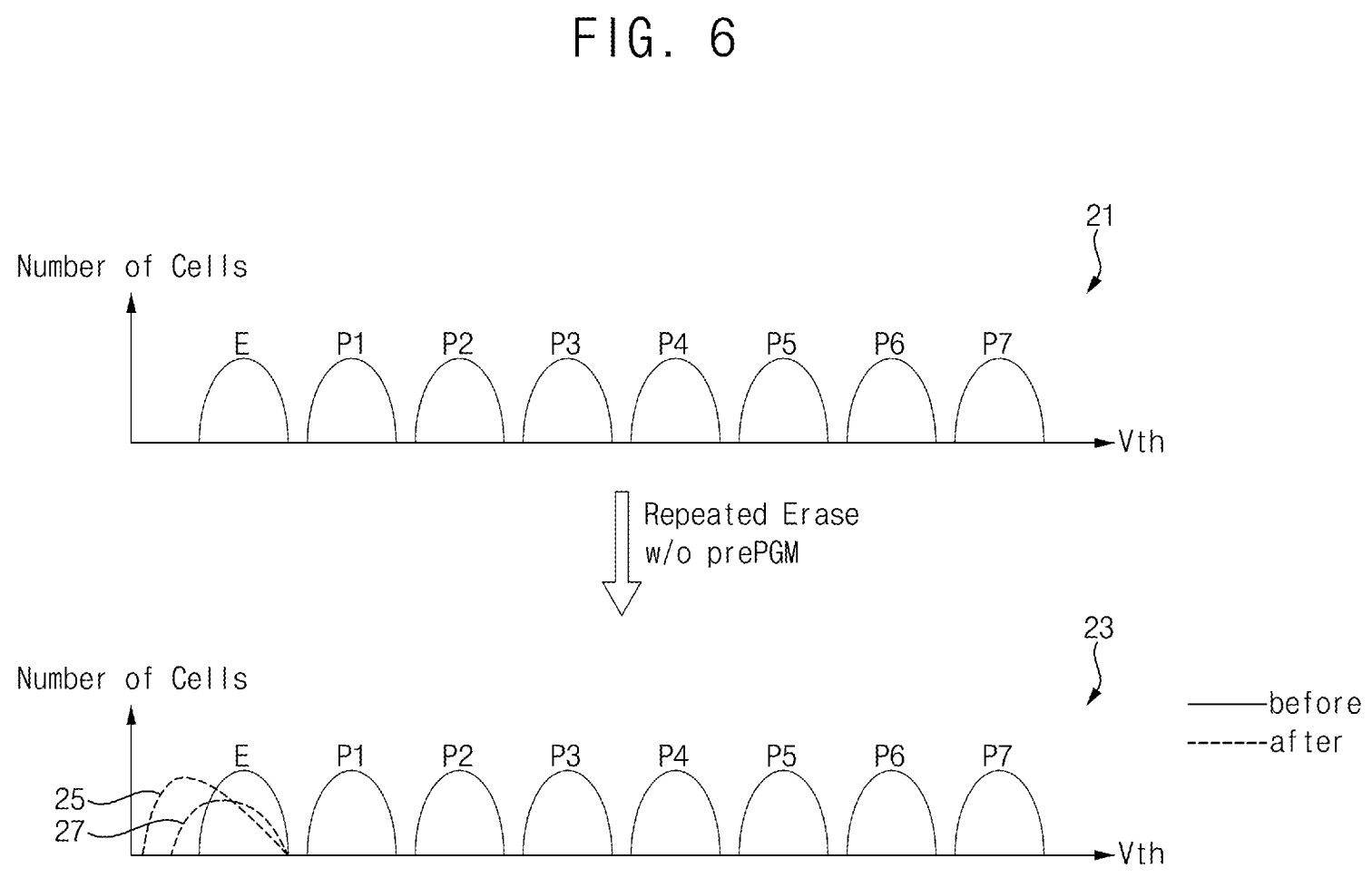

FIG. 6 is a graph showing a memory cell distribution change obtained through repetitive erase operations.

Referring to FIG. 6, a reference numeral 21 corresponds to an initial memory cell distribution based on a threshold voltage, where the horizontal axis indicates a threshold voltage "Vth", and the vertical axis indicates the number of memory cells. For example, when a memory cell is a multi-level cell which is programmed by three bits, the memory cell may be in one of an erased state E, a first program state P1, a second program state P2, a third program state P3, a fourth program state P4, a fifth program state P5, a sixth program state P6 and a seventh program state P7.

A reference numeral 23 corresponds to a memory cell distribution obtained through changing by a repetitive erase operation, where the horizontal axis indicates a threshold voltage "Vth", and the vertical axis indicates the number of memory cells. When the erase operation is repeatedly performed without performing the pre-program operation on the memory cells before performing the erase operation, an erase voltage that is a high voltage may be applied to a memory cell in the erased state E.

Therefore, as indicated by a reference numeral 25, over-erasure where threshold voltages of some memory cells become lower than an initial erased state E occurs. A trap may be generated in a gate insulation layer due to the over-erasure, and for this reason, a corresponding memory cell may be deteriorated. Also, electrons stored in the charge trap layer may move to the substrate in the erase operation, and holes of the substrate may move to the charge trap layer. In this case, holes may be excessively accumulated in the charge trap layer due to the over-erasure, and for this reason, a retention characteristic of an adjacent cell may be deteriorated.

In addition, when the erase operation is performed by unit of a sub-block, memory cells coupled to a boundary word-line of an unselected sub-block adjacent to a selected sub-block may be shallow-erased as indicated by a reference numeral 27, as the erase operation is performed on the selected sub-block.

Figure 7:
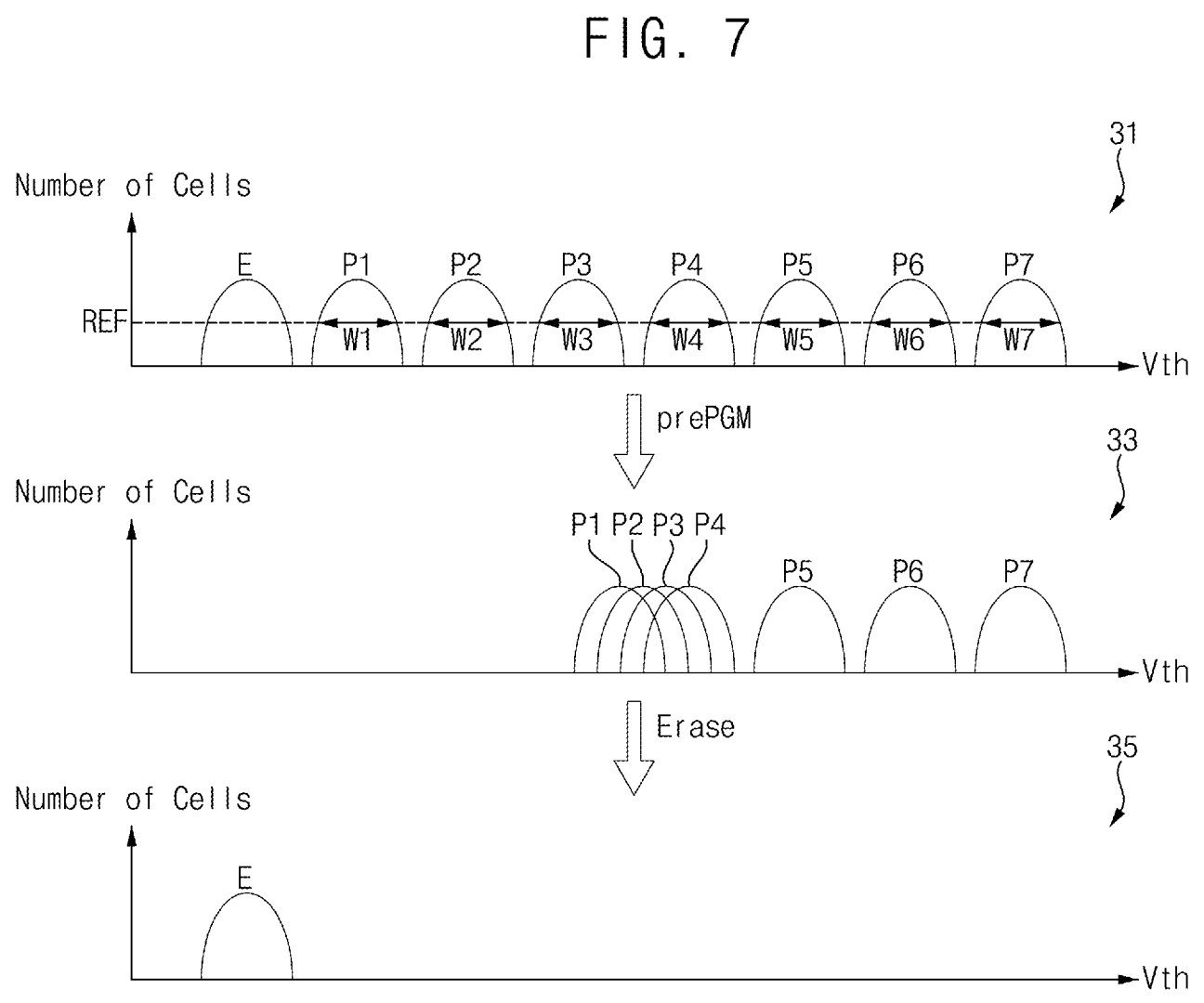

FIG. 7 is a graph showing a memory cell distribution obtained by sequentially performing a pre-program operation and an erase operation individually.

Referring to FIG. 7, a reference numeral 31 corresponds to an initial memory cell distribution based on a threshold voltage, a reference numeral 33 corresponds to a memory cell distribution when the pre-program operation with a first individual bias condition is performed on memory cells coupled to internal word-lines and boundary word-lines, and a reference numeral 35 corresponds to a memory cell distribution when the erase operation is performed. In the initial memory cell distribution corresponding to the reference numeral 31, each of the program states P1~P7 has a respective one of valid windows W1, W2, W3, W4, W5, W6 and W7 based on a reference value REF.

To prevent the memory cells from being over-erased or shallow-erased, the pre-program operation of increasing threshold voltages of the memory cells by applying a weak programming voltage (i.e., a pre-programming voltage) to the memory cells may be performed before performing the erase operation. For example, the program states P1~P4 may have partially overlapped threshold voltages due to the pre-program operation.

Subsequently, and in contrast to the reference numeral 23 of FIG. 6, by performing the erase operation on memory cells for which the pre-program operation has been performed, memory cells corresponding to the reference numeral 35 may be put in the erased state E substantially similar to the initial memory cell distribution referred to by the reference numeral 31 without being over-erased. Therefore, pre-programmed memory cells having the program states P1~P7, which are illustrated as a dotted line in the reference numeral 31 may be in the erased state E illustrated as a dotted line in the reference numeral 35.

Figure 8:
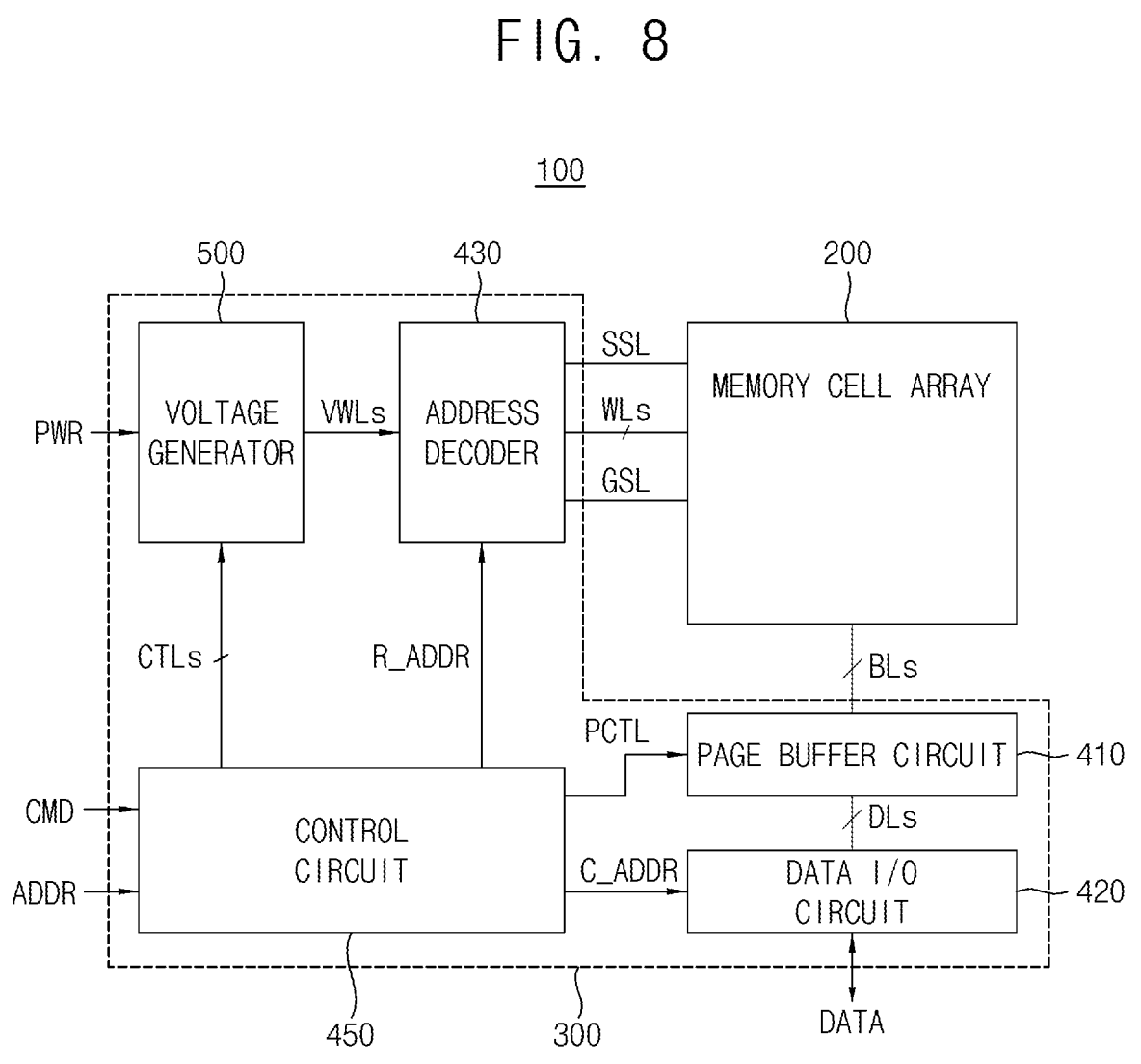

FIG. 8 is a block diagram illustrating an example of the nonvolatile memory device in the storage device of FIG. 5 according to some example embodiments.

Referring to FIG. 8, the nonvolatile memory device 100 may include a memory cell array 200 and a peripheral circuit 300. The peripheral circuit 300 may include an address decoder 430, a page buffer circuit 410, a data input/output (I/O) circuit 420, a control circuit 450 and a voltage generator 500.

The memory cell array 200 may be coupled to the address decoder 430 through a string selection line SSL, a plurality of word-lines WLs, and a ground selection line GSL. In addition, the memory cell array 200 may be coupled to the page buffer circuit 410 through a plurality of bit-lines BLs. The memory cell array 200 may include a plurality of nonvolatile memory cells coupled to the plurality of word-lines WLs and the plurality of bit-lines BLs.

In some example embodiments, the memory cell array 200 may be a three-dimensional memory cell array, which may be formed on a substrate in a three-dimensional structure (or a vertical structure). In this case, the memory cell array 200 may include vertical cell strings that are vertically oriented such that at least one memory cell may be located over another memory cell.

The control circuit 450 may receive a command (signal) CMD and an address (signal) ADDR from the memory controller 50 and control an erase loop, a program loop and a read operation of the nonvolatile memory device 200 based on the command signal CMD and the address signal ADDR. The program loop may include a program operation and a program verification operation. The erase loop may include an erase operation and an erase verification operation.

For example, the control circuit 450 may generate control signals CTLs to control the voltage generator 500 and may generate a page buffer control signal PCTL to control the page buffer circuit 410 based on the command signal CMD. The control circuit 450 may generate a row address R_ADDR and a column address C_ADDR based on the address signal ADDR. The control circuit 450 may provide the row address R_ADDR to the address decoder 430 and may provide the column address C_ADDR to the data I/O circuit 420.

The address decoder 430 may be coupled to the memory cell array 200 through the string selection line SSL, the plurality of word-lines WLs, and the ground selection line GSL. During the program operation or the read operation, the address decoder 430 may determine one of the plurality of word-lines WLs as a selected word-line and may determine a rest of the plurality of word-lines WLs except for the selected word-line as unselected word-lines based on the row address R_ADDR.

The voltage generator 500 may generate word-line voltages VWLs, which may be required for the operation of the nonvolatile memory device 200, based on the control signals CTLs. The voltage generator 500 may receive the power PWR from the memory controller 50. The word-line voltages VWLs may be applied to the plurality of word-lines WLs through the address decoder 430.

For example, during the erase operation, the voltage generator 500 may apply an erase voltage to a channel of cell strings of the memory block and may apply a ground voltage to word-lines of a sub-block to be erased. During the erase verification operation, the voltage generator 500 may apply an erase verification voltage to the word-lines of the sub-block to be erased or sequentially apply the erase verification voltage to word-lines in a word-line basis.

For example, during the program operation, the voltage generator 500 may apply a program voltage to the selected word-line and may apply a program pass voltage to the unselected word-lines. In addition, during the program verification operation, the voltage generator 500 may apply a program verification voltage to the selected word-line and may apply a verification pass voltage to the unselected word-lines.

The page buffer circuit 410 may be coupled to the memory cell array 200 through the plurality of bit-lines BLs. The page buffer circuit 410 may include a plurality of page buffers. The page buffer circuit 410 may temporarily store data to be programmed in a selected page or data that is read out from the selected page.

The data I/O circuit 420 may be coupled to the page buffer circuit 410 through a plurality of data lines DLs. During the program operation, the data I/O circuit 420 may receive program data DATA from the memory controller 50 and may provide the program data DATA to the page buffer circuit 410 based on the column address C_ADDR received from the control circuit 450. During the read operation, the data I/O circuit 420 may provide read data DATA, which may be stored in the page buffer circuit 410, to the memory controller 50 based on the column address C_ADDR received from the control circuit 450.

Figure 9:
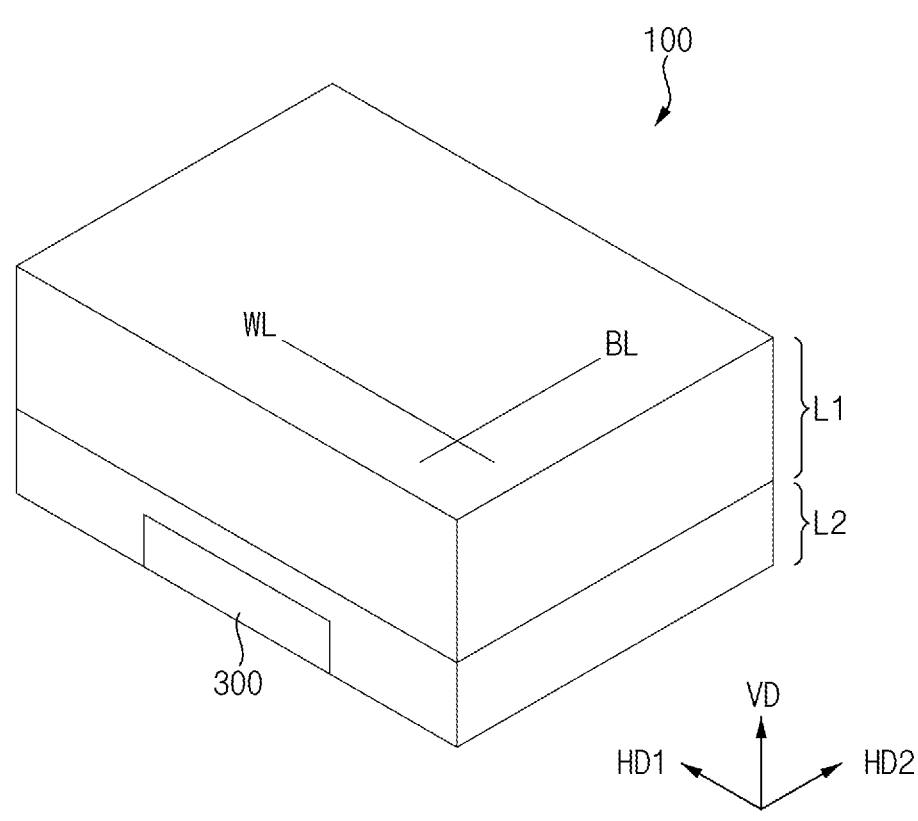
FIG. 9 schematically illustrates a structure of the nonvolatile memory device of FIG. 8 according to example embodiments.

FIG. 9 schematically illustrates a structure of the nonvolatile memory device of FIG. 8 according to example embodiments.

Referring to FIG. 9, the nonvolatile memory device 100 may include a first semiconductor layer L1 and a second semiconductor layer L2, and the first semiconductor layer L1 may be stacked in a vertical direction VD with respect to the second semiconductor layer L2. The second semiconductor layer L2 may be under the first semiconductor layer L1 in the vertical direction VD, and accordingly, the second semiconductor layer L2 may be close to a substrate.

In some example embodiments, the memory cell array 200 in FIG. 8 may be formed (or, provided) on the first semiconductor layer L1, and the peripheral circuit 300 in FIG. 8 may be formed (or, provided) on the second semiconductor layer L2. Accordingly, the nonvolatile memory device 100 may have a structure in which the memory cell array 200 is on the peripheral circuit 300, that is, a cell over periphery (COP) structure. The COP structure may effectively reduce an area in a horizontal direction and improve the degree of integration of the nonvolatile memory device 100.

In some example embodiments, the second semiconductor layer L2 may include the substrate, and by forming transistors on the substrate and metal patterns for wiring transistors, the peripheral circuit 300 may be formed in the second semiconductor layer L2. After the peripheral circuit 300 is formed on the second semiconductor layer L2, the first semiconductor layer L1 including the memory cell array 200 may be formed, and the metal patterns for connecting the word-lines WL and the bit-lines BL of the memory cell array 200 to the peripheral circuit 200 formed in the second semiconductor layer L2 may be formed. For example, the word-lines WL may extend in a first horizontal direction HD1 and the bit-lines BL may extend in a second horizontal direction HD2.

As the number of stages of memory cells in the memory cell array 200 increases with the development of semiconductor processes, that is, as the number of stacked word-lines WL increases, an area of the memory cell array 200 may decrease, and accordingly, an area of the peripheral circuit 300 may also be reduced. According to some embodiments, to reduce an area of a region occupied by the page buffer circuit 410, the page buffer circuit 410 may have a structure in which the page buffer unit and the cache latch are separated from each other, and may connect sensing nodes included in each of the page buffer units commonly to a combined sensing node.

Figure 10:
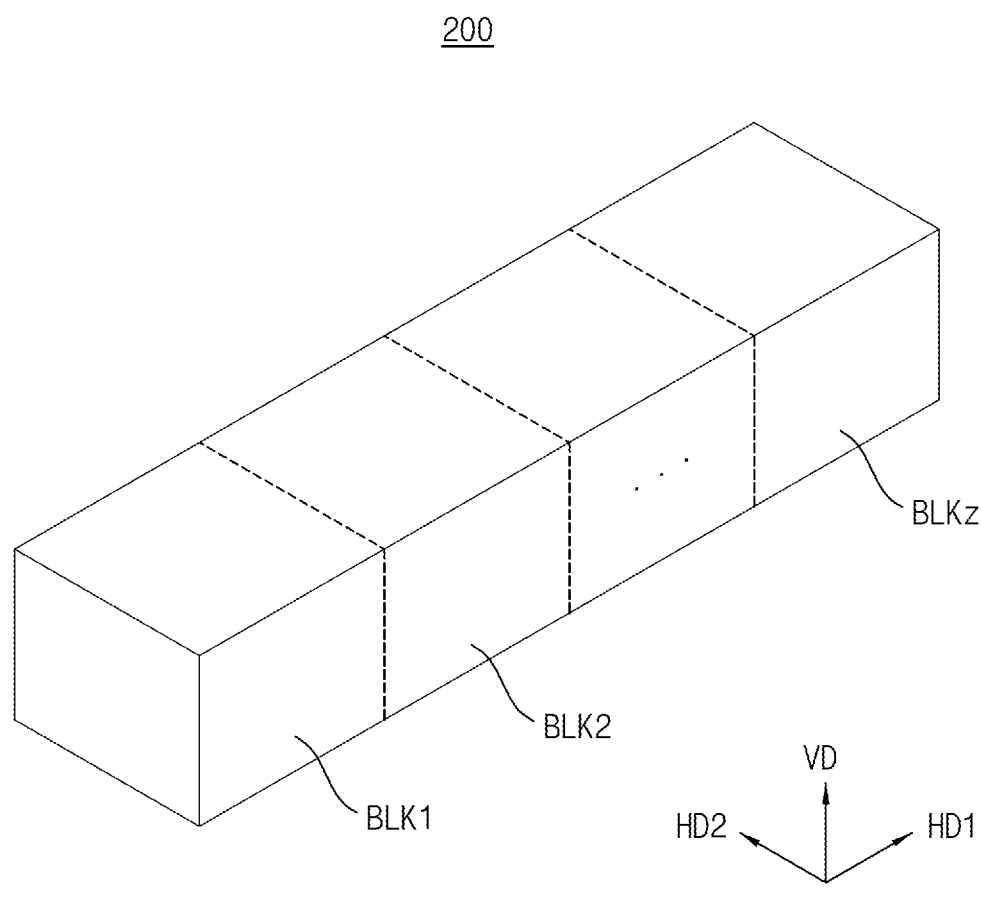
FIG. 10 is a block diagram illustrating an example of the memory cell array in the nonvolatile memory device of FIG. 8 according to example embodiments.

FIG. 10 is a block diagram illustrating an example of the memory cell array in the nonvolatile memory device of FIG. 8 according to example embodiments.

Referring to FIG. 10, the memory cell array 200 may include a plurality of memory blocks BLK1 to BLKz. Here, z is a natural number greater than two. The memory blocks BLK1 to BLKz may extend along the first horizontal direction HD1, the second horizontal direction HD2, and the vertical direction VD. In some example embodiments, the memory blocks BLK1 to BLKz may be selected by the address decoder 430 in FIG. 8. For example, the address decoder 430 may select a memory block BLK corresponding to a block address among the memory blocks BLK1 to BLKZ.

The first horizontal direction HD1 and the second horizontal direction HD2 cross each other and are substantially parallel to an upper surface to a substrate and the vertical direction VD is substantially perpendicular to the upper surface of the substrate.

Figure 11:
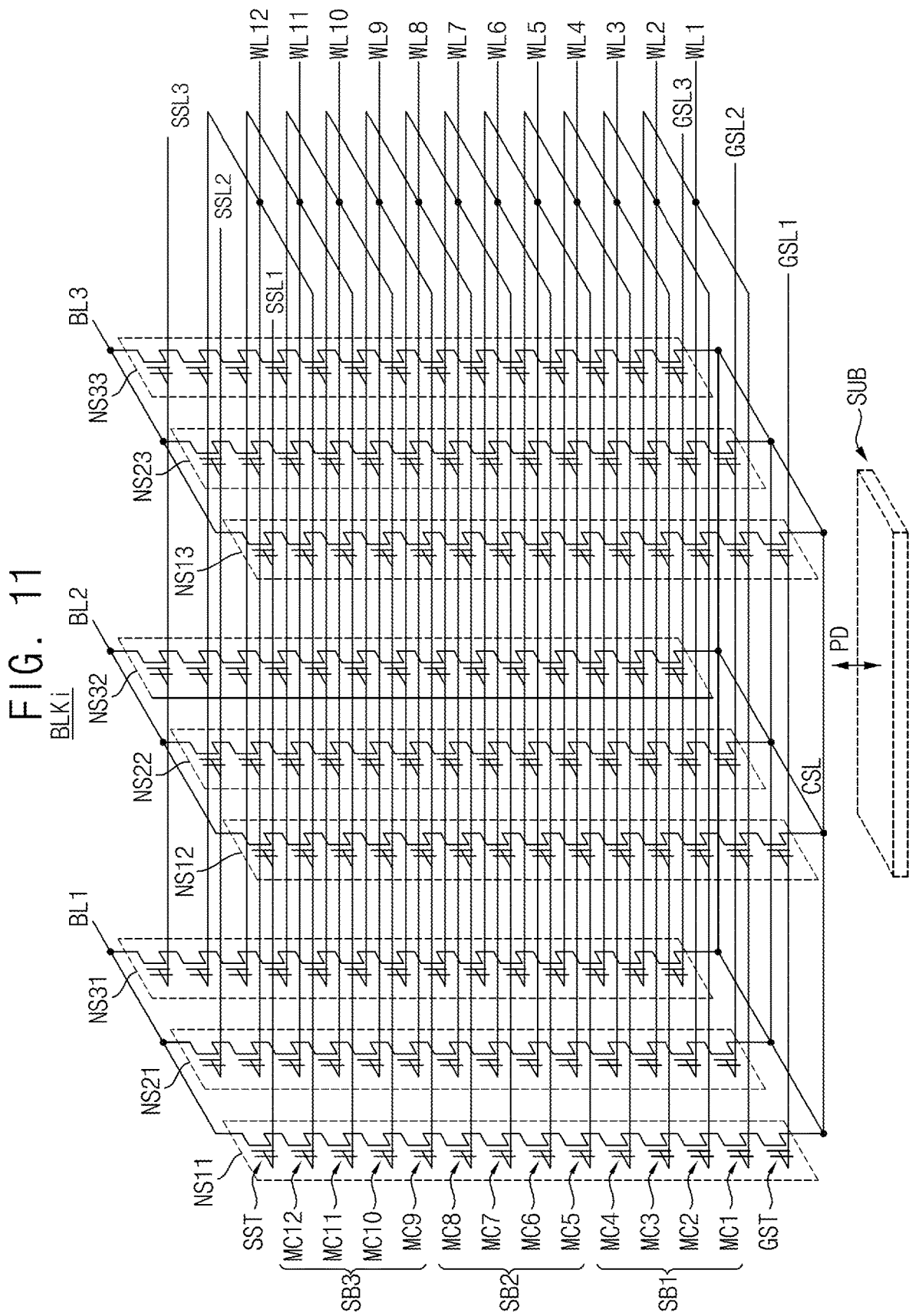
FIG. 11 is a circuit diagram illustrating one of the memory blocks of FIG. 10 according to example embodiments.

FIG. 11 is a circuit diagram illustrating one of the memory blocks of FIG. 10 according to some example embodiments.

A memory block BLKi of FIG. 11 may be formed on a substrate SUB in a three-dimensional structure (or a vertical structure). Here, i may be one of 1 to z. For example, a plurality of memory cell strings included in the memory block BLKi may be formed in the vertical direction VD perpendicular to the substrate SUB.

Referring to FIG. 11, the memory block BLKi may include a plurality of (memory) cell strings NS11 to NS33 coupled between bit-lines BL1, BL2 and BL3 and a common source line CSL. Each of the cell strings NS11 to NS33 may include a string selection transistor SST, a plurality of memory cells MC1 to MC12, and a ground selection transistor GST. In FIG. 11, each of the cell strings NS11 to NS33 is illustrated to include twelve memory cells MC1 to MC12. However, the present disclosure is not limited thereto. In some example embodiments, each of the cell strings NS11 to NS33 may include any number of memory cells.

The string selection transistor SST may be connected to corresponding string selection lines SSL1 to SSL3. The plurality of memory cells MC1 to MC12 may be connected to corresponding word-lines WL1 to WL12, respectively. The ground selection transistor GST may be connected to corresponding ground selection lines GSL1 to GSL3. The string selection transistor SST may be connected to corresponding bit-lines BL1, BL2 and BL3, and the ground selection transistor GST may be connected to the common source line CSL.

Word-lines (e.g., word-line WL1) having the same height may be commonly connected, and the ground selection lines GSL1 to GSL3 and the string selection lines SSL1 to SSL3 may be separated. In FIG. 11, the memory block BLKi is illustrated to be coupled to eight word-lines WL1 to WL12 and three bit-lines BL1 to BL3.

According to some embodiments, the memory block BLKi may be divided into a plurality of sub-blocks, indicated by representative sub-blocks SB1, SB2, and SB3, each sub-block being smaller in size than the memory block BLKi. The sub-blocks SB1, SB2 and SB3 may be divided in a word-line direction, as shown in FIG. 11. In some embodiments, the sub-blocks SB1, SB2 and SB3 may be divided on the basis of bit-lines or string selection lines. The sub-blocks SB1, SB2 and SB3 in the memory block BLKi may be erased independently of the reference used to divide the memory block BLKi into sub-blocks.

For example, the sub-block SB1 includes memory cells coupled to the word-lines WL1, WL2, WL3 and WL4, the sub-block SB2 includes memory cells coupled to the word-lines WL5, WL6, WL7 and WL8, and the sub-block SB3 includes memory cells coupled to the word-lines WL9, WL10, WL11 and WL12, from among the memory cells included in the memory block BLKi. The memory cells included in the sub-block SB1 may be selected and erased independently of the remaining sub-blocks SB2 and SB3, and vice versa. One or more of the sub-blocks SB1, SB2, and SB3 may be selected and erased at the same time or at different times. The address decoder 430 in FIG. 8 may provide a bias for erasing memory cells by sub-block unit.

Figure 12:
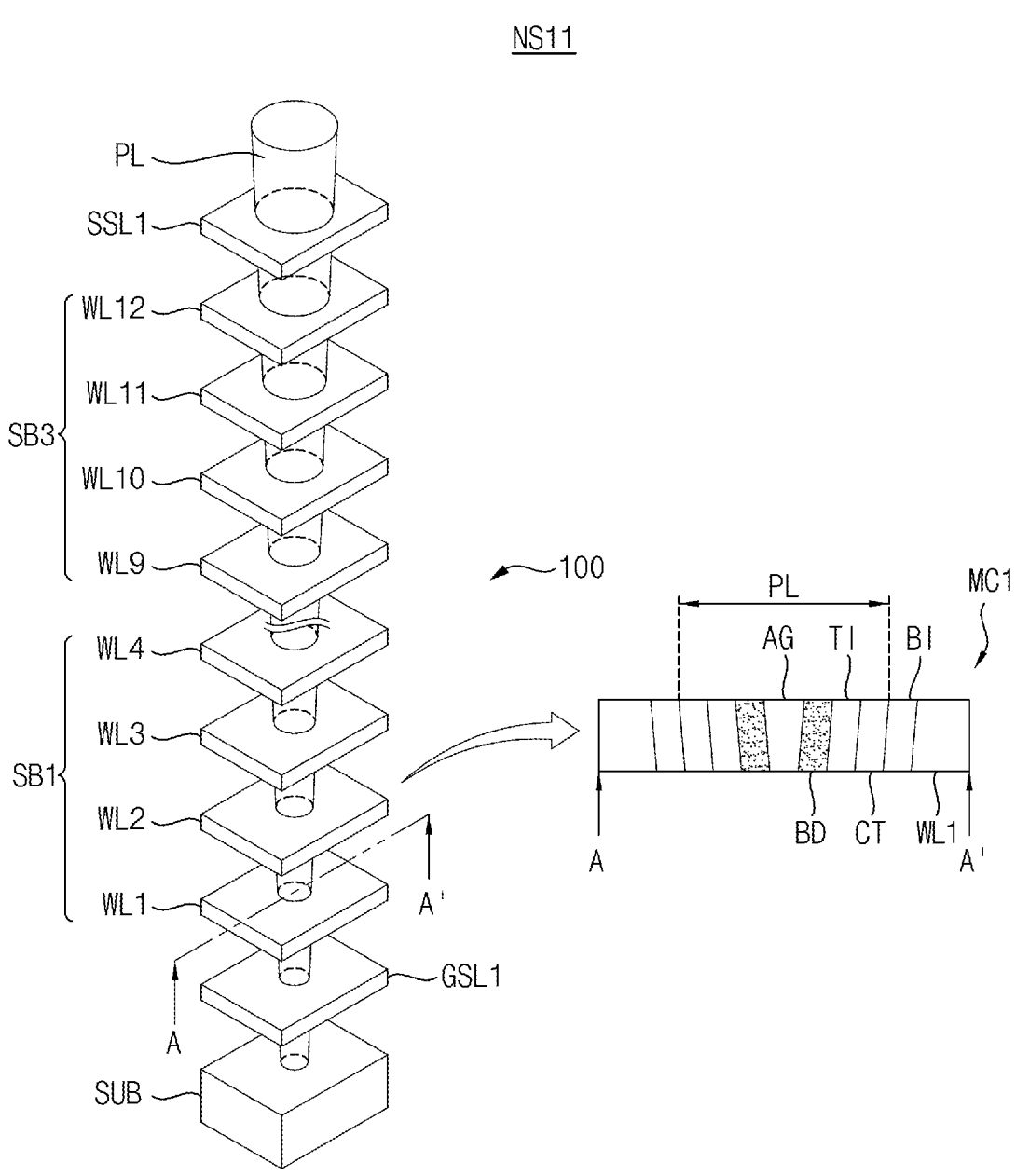
FIG. 12 illustrates an example of a structure of a cell string in the memory block of FIG. 11.

FIG. 12 illustrates an example of a structure of a cell string NS11 in the memory block of FIG. 11.

Referring to FIGS. 11 and 12 a pillar PL may be provided on the substrate SUB such that the pillar PL extends in a direction perpendicular to the substrate SUB to make contact with the substrate SUB. Each of the ground selection line GSL, the word-lines WL1 to WL12, and the string selection lines SSL illustrated in FIG. 12 may be formed of a conductive material parallel with the substrate SUB, for example, a metallic material. The pillar PL may be in contact with the substrate SUB through the conductive materials forming the string selection lines SSL, the word-lines WL1 to WL12, and the ground selection line GSL. The sub-block SB1 may include memory cells coupled to the word-lines WL1, WL2, WL3 and WL4. The sub-block SB3 may include memory cells coupled to the word-lines WL9, WL10, WL11 and WL12.

A sectional view taken along a line A-A' is also illustrated in FIG. 12. In some example embodiments, a sectional view of a first memory cell MC1 corresponding to a first wordline WL1 is illustrated. The pillar PL may include a cylindrical body BD. An air gap AG may be defined in the interior of the body BD.

The body BD may include P-type silicon and may be an area where a channel will be formed. The pillar PL may further include a cylindrical tunnel insulating layer TI surrounding the body BD and a cylindrical charge trap layer CT surrounding the tunnel insulating layer TI. A blocking insulating layer BI may be provided between the first word-line WL1 and the pillar PL. The body BD, the tunnel insulating layer TI, the charge trap layer CT, the blocking insulating layer BI, and the first word-line WL1 may constitute or be included in a charge trap type transistor that is formed in a direction perpendicular to the substrate SUB or to an upper surface of the substrate SUB. A string selection transistor SST, a ground selection transistor GST, and other memory cells may have the same structure as the first memory cell MC1.

Figure 13A:
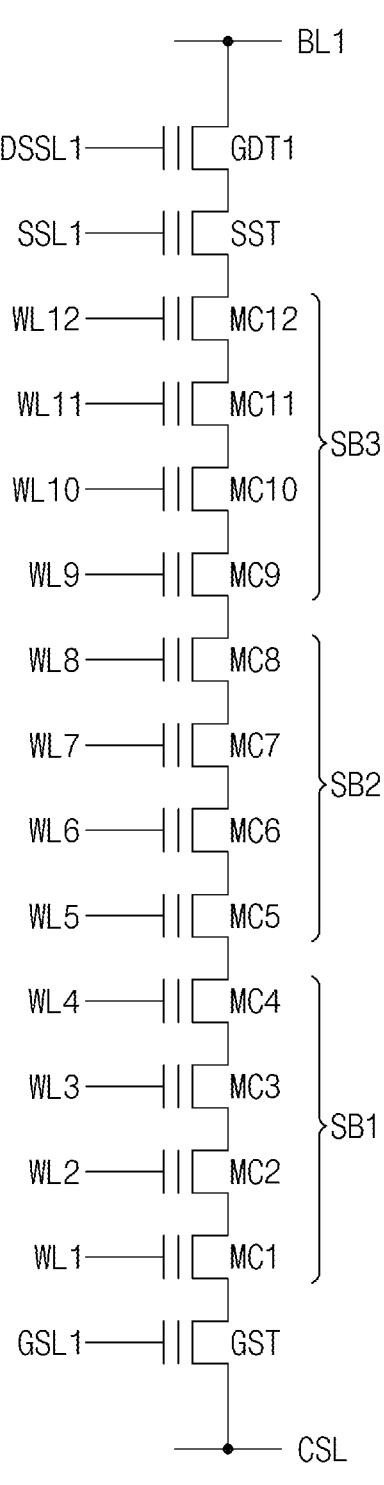
FIGS. 13A, 13B, and 13C illustrate examples of one of cell strings in FIG. 12, respectively, according to example embodiments.
Figure 13B:
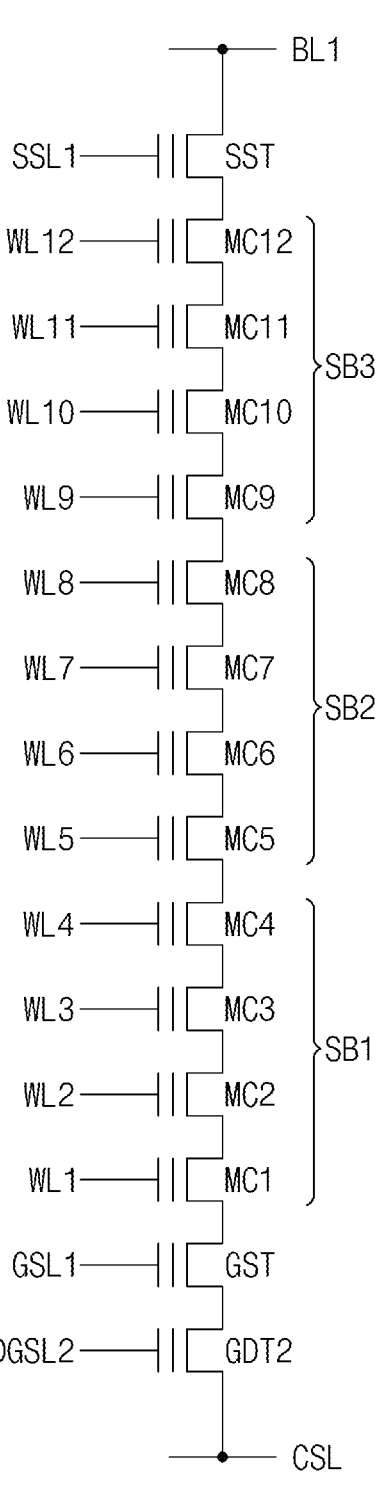
Figure 13C:
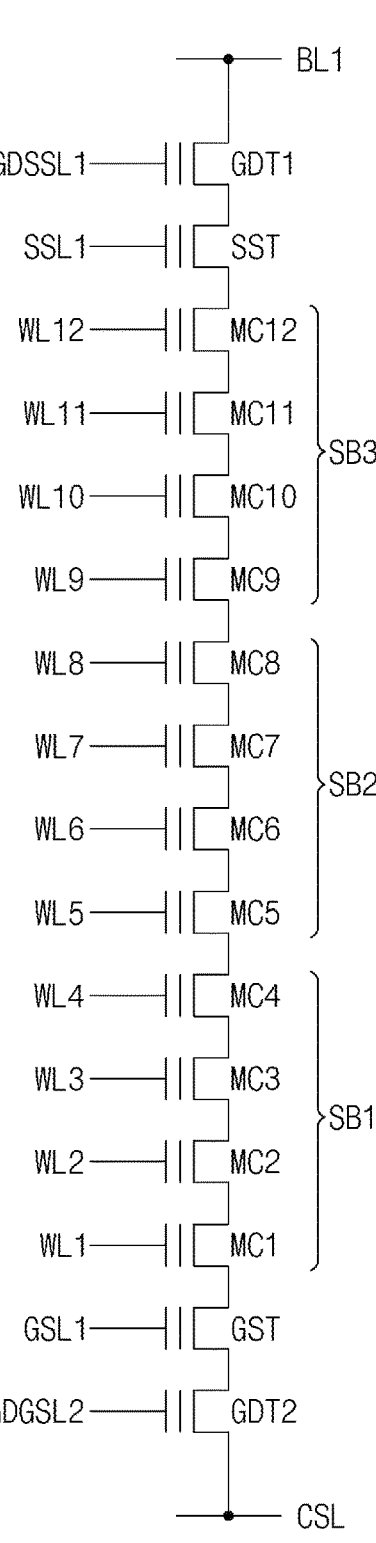

FIGS. 13A through 13C illustrate examples of one of cell strings in FIG. 12, respectively, according to example embodiments.

In each of FIGS. 13A through 13C, the sub-block SB1 may include memory cells coupled to the word-lines WL1, WL2, WL3 and WL4, the sub-block SB2 may include memory cells coupled to the word-lines WL5, WL6, WL7 and WL8, and the sub-block SB3 may include memory cells coupled to the word-lines WL9, WL10, WL11 and WL12.

Referring to FIG. 13A, a cell string NS11a may include a ground selection transistor GST, a plurality of memory cells MC1 to MC12, a string selection transistor SST and a gate induced drain leakage (GIDL) string selection transistor GDT1 connected in series between the common source line CSL and the bit-line BL1. The GIDL string selection transistor GDT1 may be coupled to a GIDL string selection line GDSSL1. The GIDL phenomenon may be generated at the GIDL string selection transistor GDT1 by applying a GIDL on voltage to the GIDL string selection line GDSSL1 such that a portion of the memory cells MC1~MC12 are erased. The GIDL on voltage corresponds to a voltage having a level to turn-on the GIDL string selection transistor GDT1. Each of the memory cell strings NS11 to NS33 in FIG. 11 may employ the cell string NS11a of FIG. 13A.

Referring to FIG. 13B, a cell string NS11b may include a GIDL ground selection transistor GDT2, a ground selection transistor GST, a plurality of memory cells MC1 to MC12 and a string selection transistor SST connected in series between the common source line CSL and the bit-line BL1. The GIDL ground selection transistor GDT2 may be coupled to a GIDL ground selection line GDGSL2. The GIDL phenomenon may be generated at the GIDL ground selection transistor GDT2 by applying a GIDL on voltage to the GIDL ground selection line GDGSL2 such that a portion of the memory cells MC1~MC12 are erased. Each of the memory cell strings NS11 to NS33 in FIG. 11 may employ the cell string NS11b of FIG. 13B.

Referring to FIG. 13C, a cell string NS11c may include a GIDL ground selection transistor GDT2, a ground selection transistor GST, a plurality of memory cells MC1 to MC12, a string selection transistor SST and a GIDL string selection transistor GDT1 connected in series between the common source line CSL and the bit-line BL1. The GIDL ground selection transistor GDT2 may be coupled to a GIDL ground selection line GDGSL2 and the GIDL string selection transistor GDT1 may be coupled to a GIDL string selection line GDSSL1. The GIDL phenomenon may be generated at the GIDL string selection transistor GDT1 and the GIDL ground selection transistor GDT2 by applying a GIDL on voltage to the GIDL string selection line GDSSL1 and the GIDL ground selection line GDGSL2 such that a portion of the memory cells MC1~MC12 are erased. Each of the memory cell strings NS11 to NS33 in FIG. 11 may employ the cell string NS11c of FIG. 13C.

Figures 14, 15:
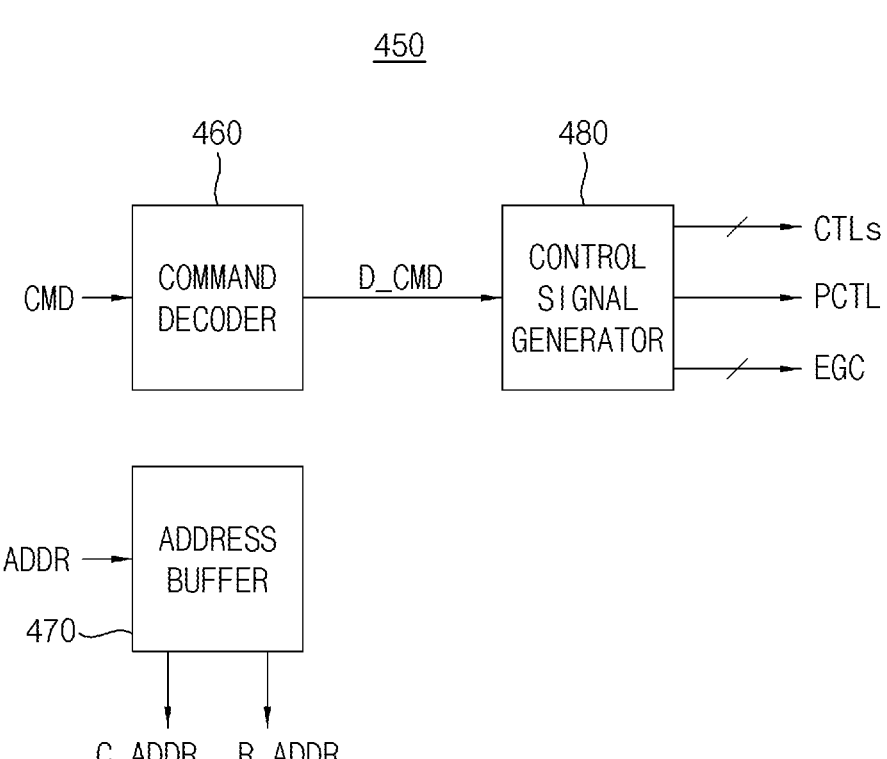
FIG. 14 is a block diagram illustrating the control circuit in the nonvolatile memory device of FIG. 9 according to example embodiments.
FIG. 15 is a block diagram illustrating the voltage generator in the nonvolatile memory device of FIG. 8 according to example embodiments.

FIG. 14 is a block diagram illustrating the control circuit in the nonvolatile memory device of FIG. 9 according to some example embodiments.

Referring to FIG. 14, the control circuit 450 may include a command decoder 460, an address buffer 470 and a control signal generator 480.

The command decoder 460 may decode the command CMD and provides a decoded command D_CMD to the control signal generator 480.

The address buffer 470 may receive the address (signal) ADDR, may provide the row address R_ADDR to the address decoder 430, and may provide the column address C_ADDR to the data I/O circuit 420.

Figure 17:
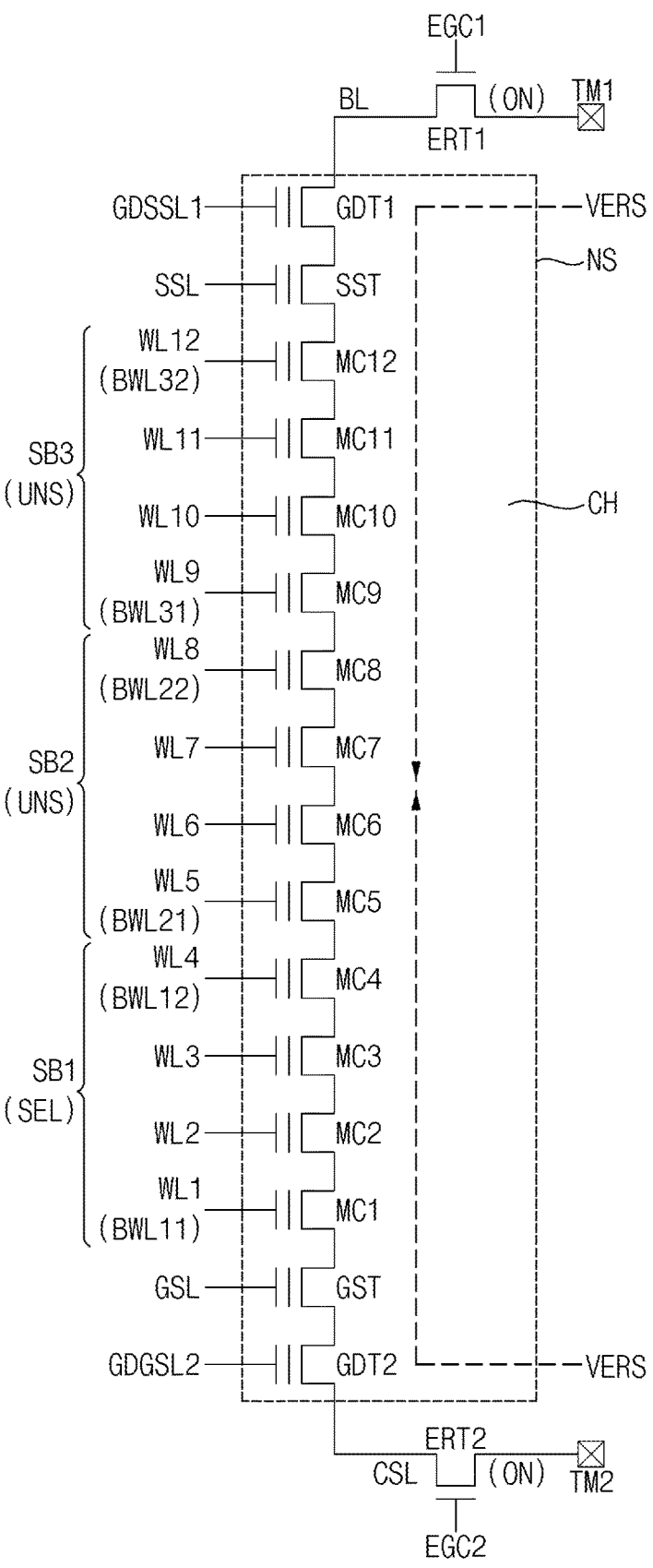
FIGS. 17, 19 and 21 illustrate an example of a cell string on which an erase operation is performed by unit of a sub-block, respectively.

The control signal generator 480 may receive the decoded command D_CMD, may generate the control signals CTLs based on an operation directed by the decoded command D_CMD, may provide the control signals CTLs to the voltage generator 500, may generate the page buffer control signal PCTL, may provide the page buffer control signal PCTL to the page buffer circuit 410, may generate an erase control signal EGC, and may provide the erase control signal EGC to erase transistors (ERT1 and ERT2 in FIG. 17).

FIG. 15 is a block diagram illustrating the voltage generator in the nonvolatile memory device of FIG. 8 according to example embodiments.

Referring to FIG. 15, the voltage generator 500 may include a high voltage HV generator 510 and a low voltage LV generator 520. The voltage generator 500 may further include a negative voltage NV generator 530.

The high voltage generator 510 may generate a program voltage VPGM, a program pass voltage VPPASS, a verification pass voltage VVPASS, a read pass voltage VRPASS, a pre-program voltage VPPGM and an erase voltage VERS according to operations directed by the command CMD, in response to a first control signal CTL1. The program pass voltage VPPASS, the verification pass voltage VVPASS and the read pass voltage VRPASS may be included in the pass voltage VPASS.

The program voltage VPGM may be applied to the selected word-line, the program pass voltage VPPASS, the verification pass voltage VVPASS, the read pass voltage VRPASS may be applied to the unselected word-lines, the pre-program voltage VPPGM may be applied to the internal word-lines and boundary word-lines of the selected sub-block and the erase voltage VERS may be applied to a channel through erase transistors (ERT1 and ERT2 in FIG. 17). The first control signal CTL1 may include a plurality of bits which indicate the operations directed by the decoded command D_CMD.

The low voltage generator 520 may generate a program verification voltage VPV, an erase verification voltage VER, a read voltage VRD and erase verification voltages VEV1 and VEV2 according to operations directed by the command CMD, in response to a second control signal CTL2.

The program verification voltage VPV, the read voltage VRD, and erase verification voltages VEV1 and VEV2 may be applied to word-lines of the selected sub-block according to operation of the nonvolatile memory device 200. The second control signal CTL2 may include a plurality of bits which indicate the operations directed by the decode command D_CMD.

The negative voltage generator 530 may generate a first negative voltage VNEG1 and a second negative voltage VNEG2 which have negative levels according to operations directed by the command CMD, in response to a third control signal CTL3. The third control signal CTL3 may include a plurality of bits which indicate the operations directed by the decoded command D_CMD. The first negative voltage VNEG1 and the second negative voltage VNEG2 may be used for the program operation.

Figure 16:
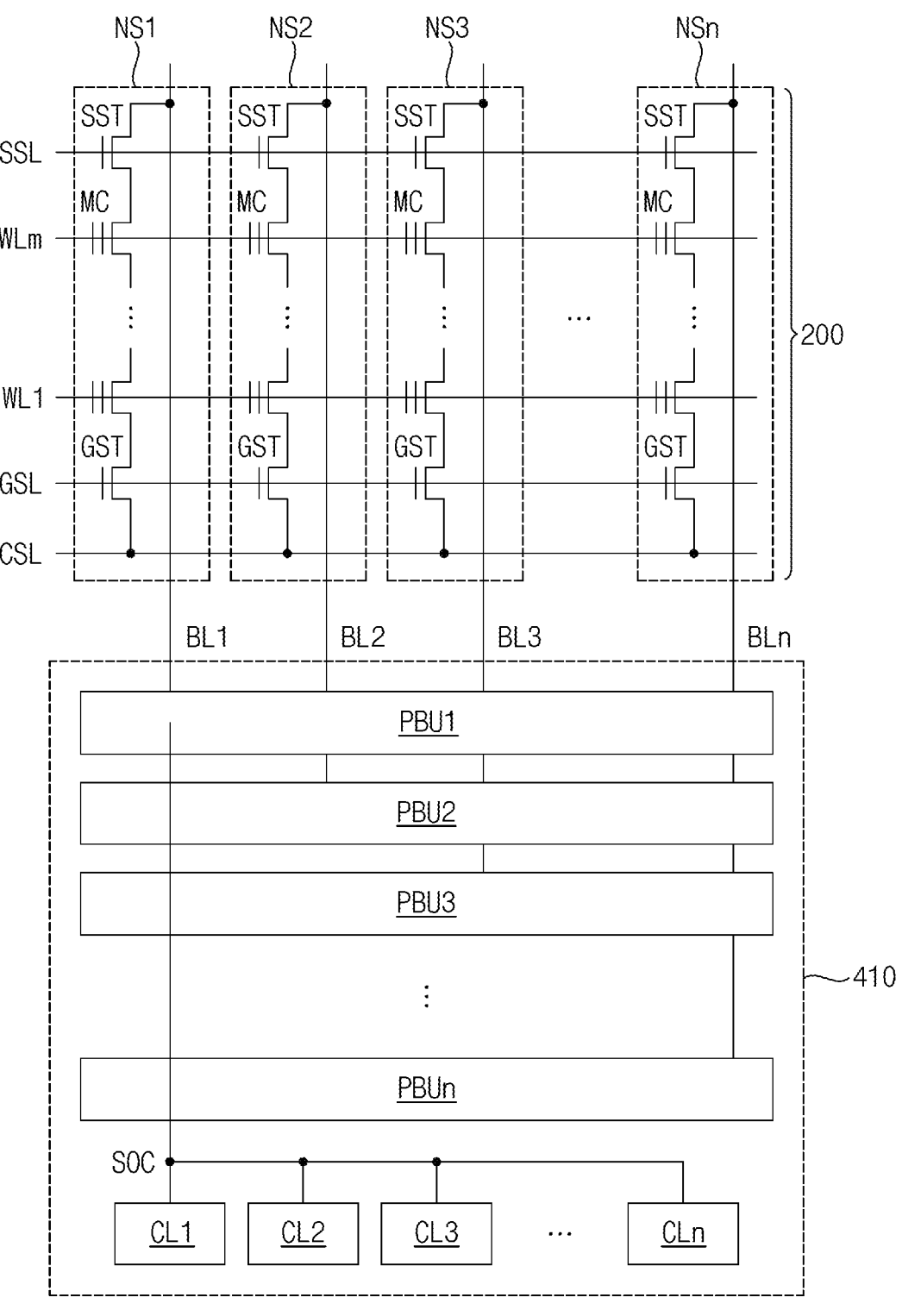
FIG. 16 is a schematic diagram of a connection of the memory cell array to the page buffer circuit in FIG. 8, according to example embodiments.

FIG. 16 is a schematic diagram of a connection of the memory cell array to the page buffer circuit in FIG. 8, according to some example embodiments.

Referring to FIG. 16, the memory cell array 200 may include first through n-th cell strings NS1, NS2, NS3, . . . , NSn. Each of the first through n-th cell strings NS1, NS2, NS3, . . . , NSn may include a ground select transistor GST connected to the ground select line GSL, a plurality of memory cells MC respectively connected to the first through m-th word-lines WL1, . . . , WLm, and a string select transistor SST connected to the string select line SSL, and the ground select transistor GST, the plurality of memory cells MC, and the string select transistor SST may be connected to each other in series. In this case, m may be a positive integer.

The page buffer circuit 410 may include first through n-th page buffer units PBU1, PBU2, PBU3, . . . , PBUn. The first page buffer unit PB1 may be connected to the first cell string NS1 via the first bit-line BL1, and the n-th page buffer unit PBUn may be connected to the n-th cell string NSn via the n-th bit-line BLn. In this case, n may be a positive integer. For example, n may be 8, and the page buffer circuit 410 may have a structure in which page buffer units of eight stages, or, the first through n-th page buffer units PBU1, PBU2, PBU3, . . . , PBUn are in a line. For example, the first through n-th page buffer units PBU1, PBU2, PBU3, . . . , PBUn may be in a row in an extension direction or length direction of the first through n-th bit-lines BL1 through BLn.

The page buffer circuit 410 may further include first through n-th cache latches CL1, CL2, CL3, . . . , CLn respectively corresponding to the first through n-th page buffer units PBU1, PBU2, PBU3, . . . , PBUn. For example, the page buffer circuit 410 may have a structure in which the cache latches of eight stages or the first through n-th cache latches CL1, CL2, CL3, . . . , CLn in a line. For example, the first through n-th cache latches CL1, CL2, CL3, . . . , CLn may be in a row in an extension direction of the first through n-th bit-lines BL1, BL2, BL3, . . . , BLn.

The sensing nodes of each of the first through n-th page buffer units PBU1, PBU2, PBU3, . . . , PBUn may be commonly connected to a combined sensing node SOC. In addition, the first through n-th cache latches CL1, CL2, CL3, . . . , CLn may be commonly connected to the combined sensing node SOC. Accordingly, the first through n-th page buffer units PBU1 through PBUn may be connected to the first through n-th cache latches CL1, CL2, CL3, . . . , CLn via the combined sensing node SOC.

Figure 19:
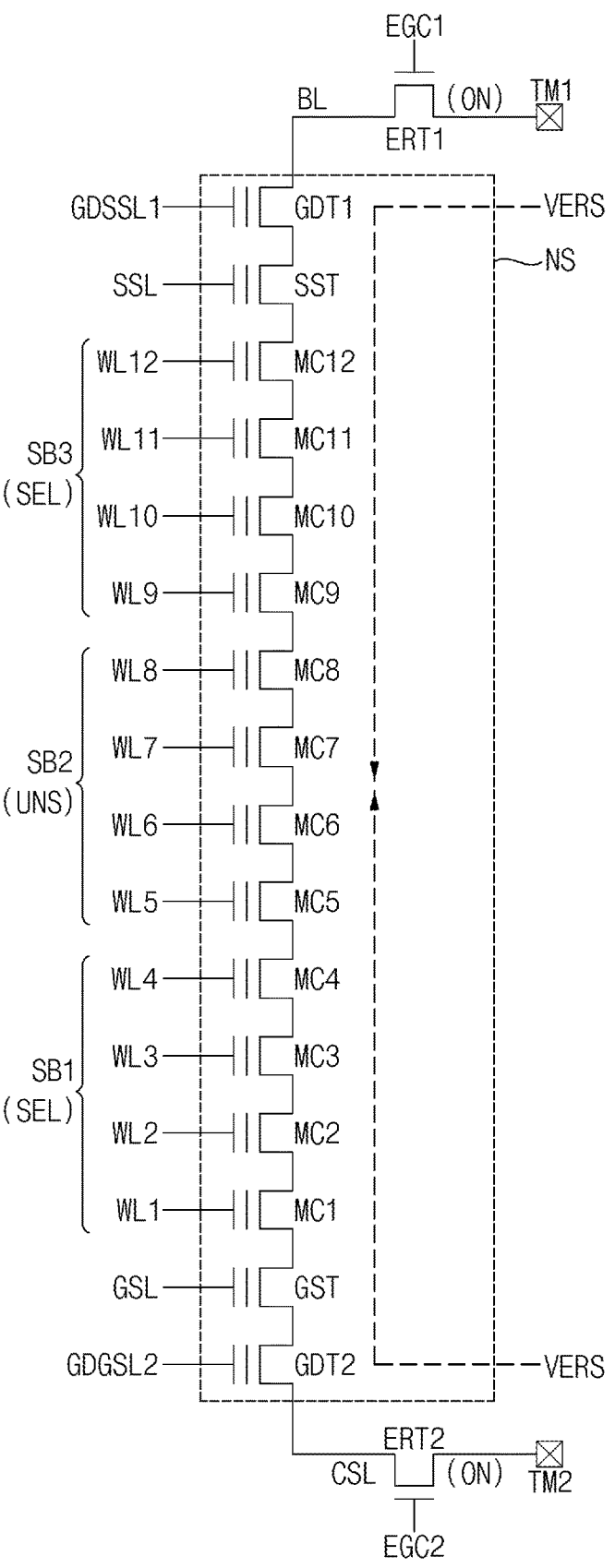
Figure 21:
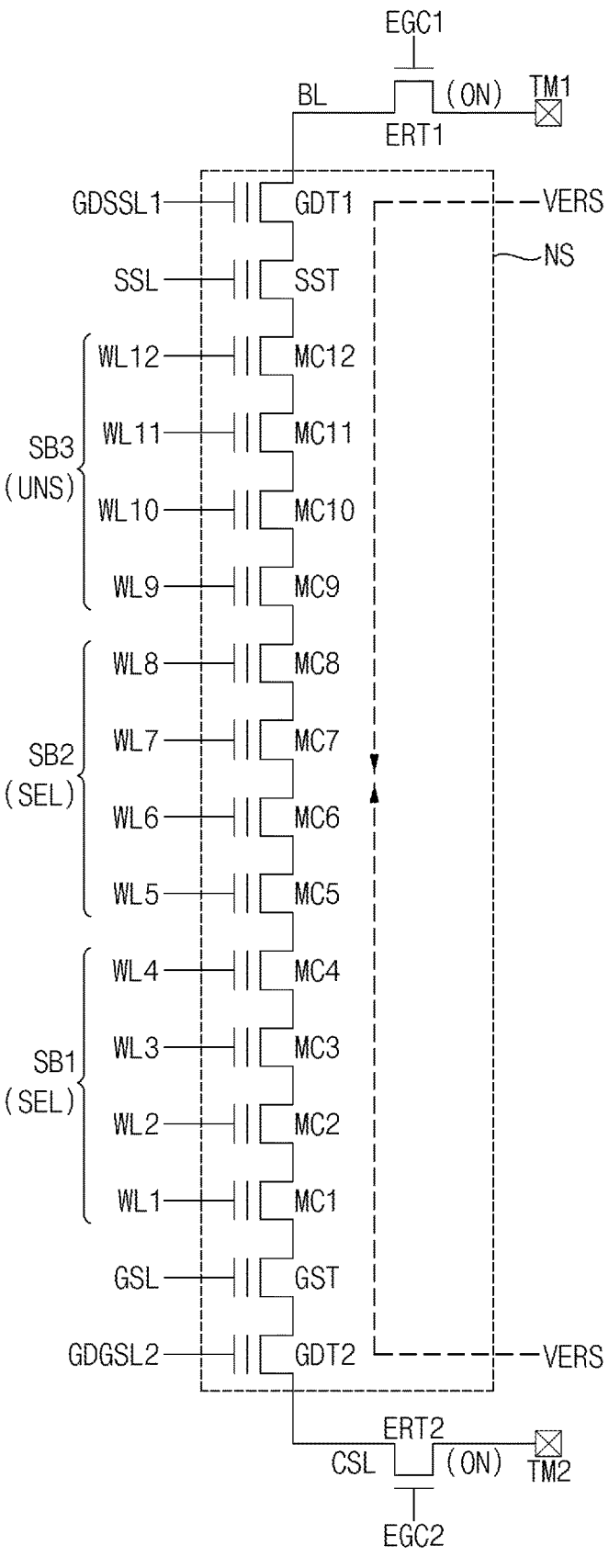

FIGS. 17, 19 and 21 illustrate an example of a cell string on which an erase operation is performed by unit of a sub-block, respectively.

In each of FIGS. 17, 19 and 21, a cell string NS includes a GIDL ground selection transistor GDT2, a ground selection transistor GST, a plurality of memory cells MC1 to MC12, a string selection transistor SST and a GIDL string selection transistor GDT1 connected in series between the common source line CSL and the bit-line BL. The GIDL ground selection transistor GDT2 may be coupled to a GIDL ground selection line GDGSL2 and the GIDL string selection transistor GDT1 may be coupled to a GIDL string selection line GDSSL1. The erase transistor ERT1 may be connected between the bit-line BL and a first terminal TM1 and may have a gate receiving the erase control signal EGC1. The erase transistor ERT2 may be connected between the common source line CSL and a second terminal TM2 and may have a gate receiving the erase control signal EGC2.

In addition, the cell string NS may be divided into a first sub-block SB1, a second sub-block SB2 and a third sub-block SB3 stacked sequentially in a direction from the common source line CSL and the bit-line BL. The first sub-block SB1 may include memory cells coupled to the word-lines WL1, WL2, WL3 and WL4, the second sub-block SB2 may include memory cells coupled to the word-lines WL5, WL6, WL7 and WL8, and the third sub-block SB3 may include memory cells coupled to the word-lines WL9, WL10, WL11 and WL12.

In the first sub-block SB1, the word-lines WL1 and WL4 may correspond to boundary word-lines BWL11 and BWL12 and the word-lines WL2 and WL2 may correspond to internal word-lines. In the second sub-block SB2, the word-lines WL5 and WL8 may correspond to boundary word-lines BWL21 and BWL22 and the word-lines WL6 and WL7 may correspond to internal word-lines. In the third sub-block SB3, the word-lines WL9 and WL12 may correspond to boundary word-lines BWL31 and BWL32 and the word-lines WL10 and WL11 may correspond to internal word-lines.

When the erase operation is performed on the cell string NS in FIGS. 17, 19 and 21, the erase voltage VERS may be applied to a channel CH of the cell string NS through the erase transistors ERT1 and ERT2 by applying the erase control signals EGC1 and EGC2 to the erase transistors ERT1 and ERT2, respectively, to turn-on the erase transistors ERT1 and ERT2.

Figure 18:
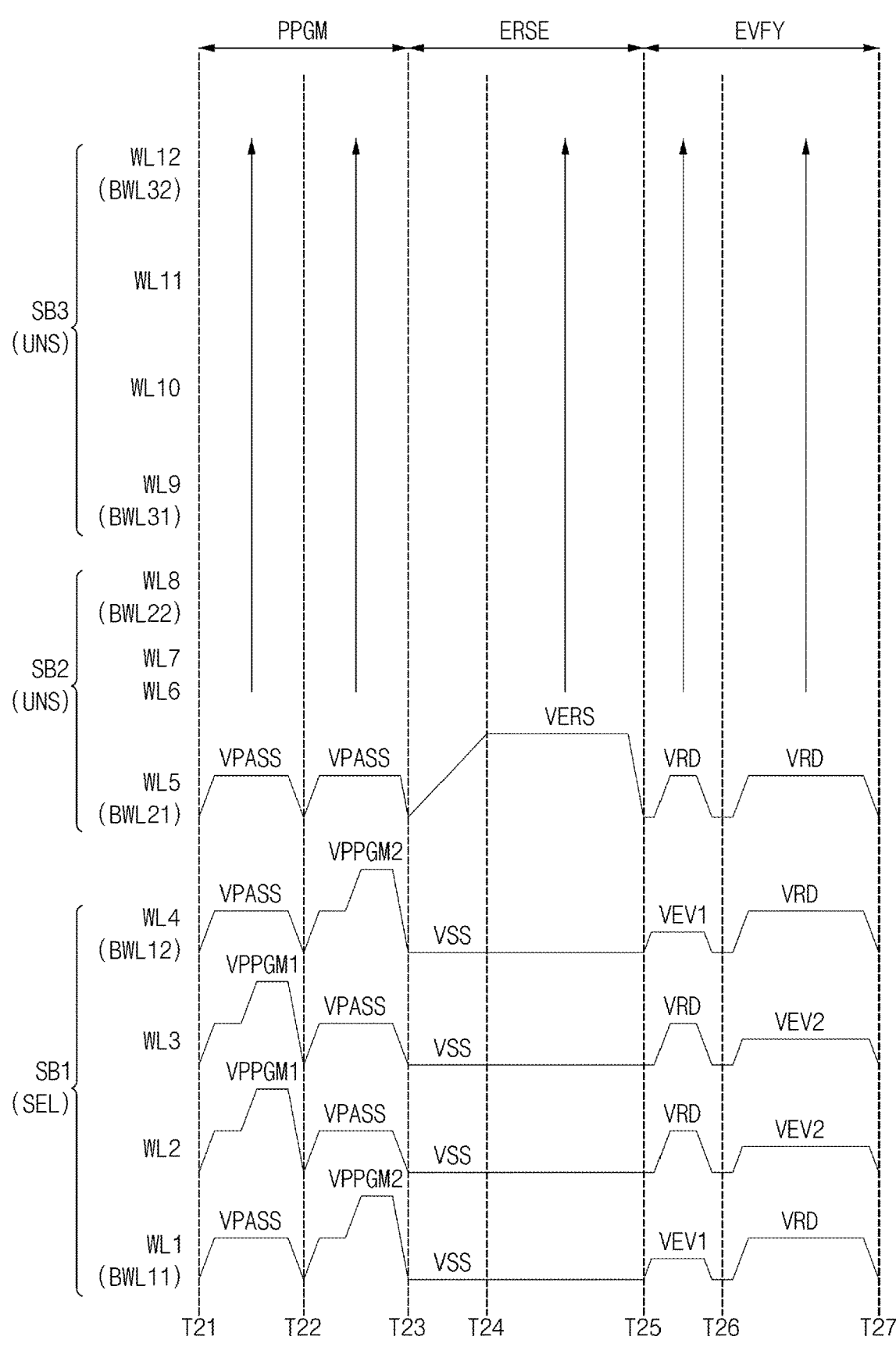
FIG. 18 illustrates voltages applied to the sub-blocks when one of the first through third sub-blocks in the FIG. 17 is selected as a sub-block to be erased.

FIG. 18 illustrates voltages applied to the sub-blocks when one of the first through third sub-blocks in the FIG. 17 is selected as a sub-block to be erased.

Referring to FIGS. 17 and 18, when the first sub-block SB1 is selected as the sub-block to be erased as denoted by SEL, during a first sub-period T21~T22 of the pre-program period PPGM, the control circuit 450 in FIG. 8 may control the voltage generator 500 and the address decoder 460 to apply the first pre-program voltage VPPGM1 to the internal word-lines WL2 and WL3 of the first sub-block SB1, to apply the pass voltage VPASS to the boundary word-lines WL1 and WL4 of the first sub-block SB1 and to apply the pass voltage VPASS to the word-lines WL5~WL8 of the second sub-block SB2 the word-lines WL9~WL12 of the third sub-block SB3. The second sub-block SB2 and the third sub-block SB3 are sub-blocks not to be erased, as denoted by UNS.

During a second sub-period T22~T23 of the pre-program period PPGM, the control circuit 450 in FIG. 8 may control the voltage generator 500 and the address decoder 460 to apply the second pre-program voltage VPPGM2 to the boundary word-lines WL1 and WL4 of the first sub-block SB1, to apply the pass voltage VPASS to the internal word-lines WL2 and WL3 of the first sub-block SB1 and to apply the pass voltage VPASS to the word-lines WL5~WL8 of the second sub-block SB2 and the word-lines WL9~WL12 of the third sub-block SB3.

During the erase execution period ERSE between time point T23 and T25, the control circuit 450 in FIG. 8 may control the voltage generator 500 and the address decoder 460 to apply the erase voltage VRES arriving at a target level at a time point T24 to the channel CH of the cell string NS through the erase transistors ERT1 and ERT2, to apply a ground voltage VSS to the word-lines WL1~WL4 of the first sub-block SB1 to erase memory cells coupled to the word-lines WL1~WL4 and to float the word-lines WL5~WL8 of the second sub-block SB2 the word-lines WL9~WL12 of the third sub-block SB3.

During a first sub-period T25~T26 of the erase verification period EVFY, the control circuit 450 in FIG. 8 may control the voltage generator 500 and the address decoder 460 to apply the first erase verification voltage VEV1 to the boundary word-lines WL1 and WL4 of the first sub-block SB1, to apply the read voltage VRD to the internal word-lines WL2 and WL3 of the first sub-block SB1 and to apply the read voltage VRD to the word-lines WL5~WL8 of the second sub-block SB2 and the word-lines WL9~WL12 of the third sub-block SB3.

During a second sub-period T26~T27 of the erase verification period EVFY, the control circuit 450 in FIG. 8 may control the voltage generator 500 and the address decoder 460 to apply the read voltage VRD to the boundary word-lines WL1 and WL4 of the first sub-block SB1, to apply the second erase verification voltage VEV2 to the internal word-lines WL2 and WL3 of the first sub-block SB1 and to apply the read voltage VRD to the word-lines WL5~WL8 of the second sub-block SB2 and the word-lines WL9~WL12 of the third sub-block SB3.

Figure 20:
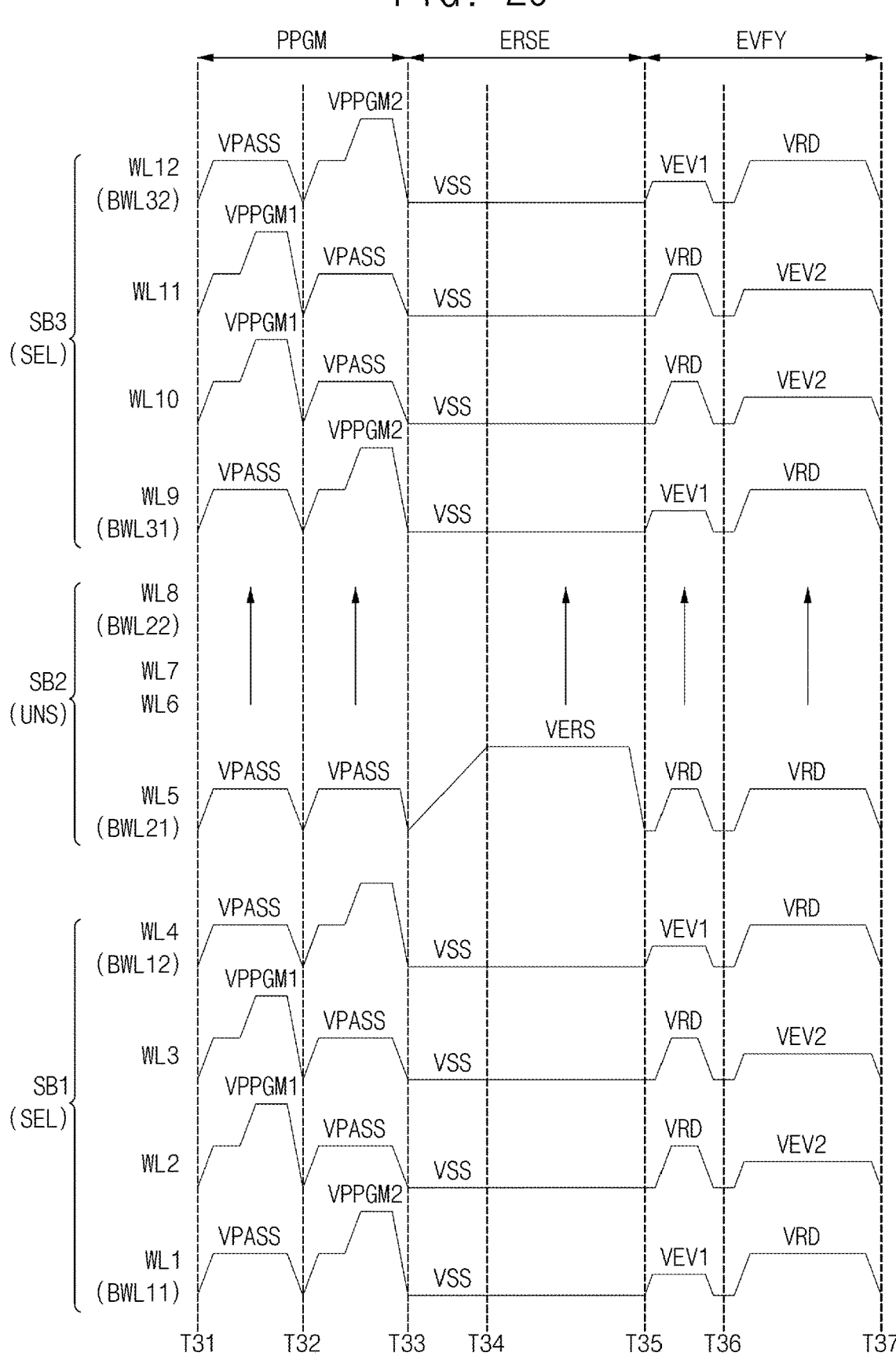
FIG. 20 illustrates voltages applied to the sub-blocks when two sub-blocks not adjacent to each other from among the first through third sub-blocks in the FIG. 19 are selected as sub-blocks to be erased.

FIG. 20 illustrates voltages applied to the sub-blocks when two sub-blocks not adjacent to each other from among the first through third sub-blocks in the FIG. 19 are selected as sub-blocks to be erased.

Referring to FIGS. 19 and 20, when the first sub-block SB1 and the third sub-block SB3 that are not adjacent to each other are selected as the sub-blocks to be erased as denoted by SEL, during a first sub-period T31~T32 of the pre-program period PPGM, the control circuit 450 in FIG. 8 may control the voltage generator 500 and the address decoder 460 to apply the first pre-program voltage VPPGM1 to the internal word-lines WL2 and WL3 of the first sub-block SB1 and the internal word-lines WL10 and WL11 of the third sub-block SB3, to apply the pass voltage VPASS to the boundary word-lines WL1 and WL4 of the first sub-block SB1 and the boundary word-lines WL9 and WL12 of the third sub-block SB3 and to apply the pass voltage VPASS to the word-lines WL5~WL8 of the second sub-block SB2. The second sub-block SB2 is a sub-block not to be erased as denoted by UNS.

During a second sub-period T32~T33 of the pre-program period PPGM, the control circuit 450 in FIG. 8 may control the voltage generator 500 and the address decoder 460 to apply the second pre-program voltage VPPGM2 to the boundary word-lines WL1 and WL4 of the first sub-block SB1 and to the boundary word-lines WL9 and WL12 of the third sub-block SB3, to apply the pass voltage VPASS to the internal word-lines WL2 and WL3 of the first sub-block SB1 and to the internal word-lines WL10 and WL11 of the third sub-block SB3, and to apply the pass voltage VPASS to the word-lines WL5~WL8 of the second sub-block SB2.

During the erase execution period ERSE between time point T33 and T35, the control circuit 450 in FIG. 8 may control the voltage generator 500 and the address decoder 460 to apply the erase voltage VRES arriving at a target level at a time point T34 to the channel CH of the cell string NS through the erase transistors ERT1 and ERT2, to apply a ground voltage VSS to the word-lines WL1~WL4 of the first sub-block SB1 and to the word-lines WL9~WL12 of the third sub-block SB3 to erase memory cells coupled to the word-lines WL1~WL4 and memory cells coupled to the word-lines WL9~WL12, and to float the word-lines WL5~WL8 of the second sub-block SB2.

During a first sub-period T35~T36 of the erase verification period EVFY, the control circuit 450 in FIG. 8 controls the voltage generator 500 and the address decoder 460 to apply the first erase verification voltage VEV1 to the boundary word-lines WL1 and WL4 of the first sub-block SB1 and to the boundary word-lines WL9 and WL12 of the third sub-block SB3, to apply the read voltage VRD to the internal word-lines WL2 and WL3 of the first sub-block SB1 and the internal word-lines WL10 and WL11 of the third sub-block SB3 and apply the read voltage VRD to the word-lines WL5~WL8 of the second sub-block SB2.

During a second sub-period T36~T37 of the erase verification period EVFY, the control circuit 450 in FIG. 8 may control the voltage generator 500 and the address decoder 460 to apply the read voltage VRD to the boundary word-lines WL1 and WL4 of the first sub-block SB1 and to the boundary word-lines WL9 and WL12 of the third sub-block SB3, to apply the second erase verification voltage VEV2 to the internal word-lines WL2 and WL3 of the first sub-block SB1 and to the internal word-lines WL10 and WL11 of the third sub-block SB3, and to apply the read voltage VRD to the word-lines WL5~WL8 of the second sub-block SB2.

Figure 22:
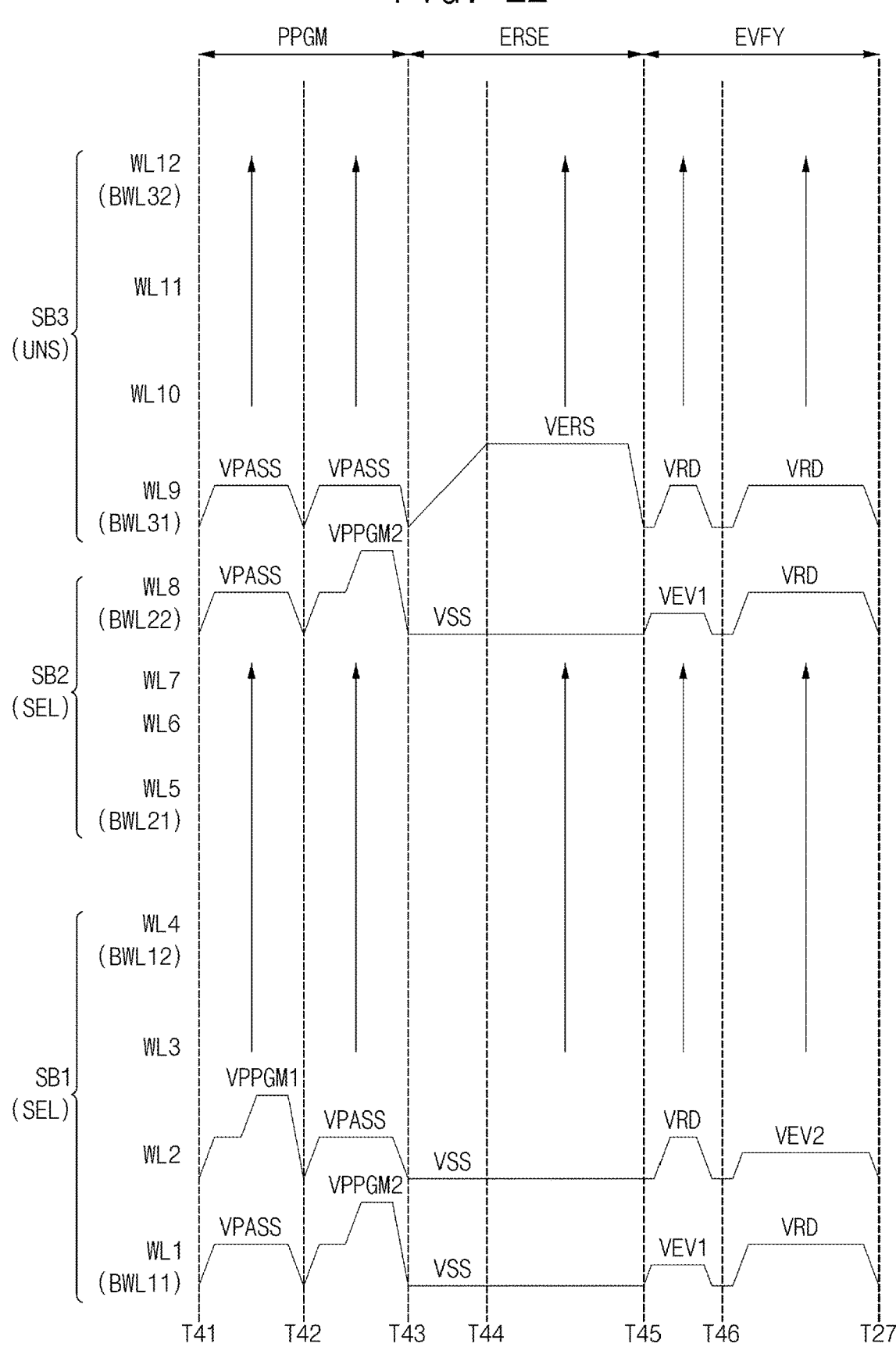
FIG. 22 illustrates voltages applied to the sub-blocks when two sub-blocks adjacent to each other from among the first through third sub-blocks in the FIG. 21 are selected as sub-blocks to be erased.

FIG. 22 illustrates voltages applied to the sub-blocks when two sub-blocks adjacent to each other from among the first through third sub-blocks in the FIG. 21 are selected as sub-blocks to be erased.

When the first sub-block SB1 and the second sub-block SB2 that are adjacent to each other are selected as the sub-blocks to be erased as denoted by SEL in FIG. 22, the control circuit 450 in FIG. 8 may manage the boundary word-line WL4 adjacent to the second sub-block SB2 and the boundary word-line WL5 adjacent to the first sub-block SB1 as the internal word-lines. The boundary word-lines WL4 and WL5 may be referred to as adjacent boundary word-lines. The boundary word-lines WL1 and WL8 may be referred to as non-adjacent boundary word-lines.

Referring to FIGS. 21 and 22, when the first sub-block SB1 and the second sub-block SB2 are selected as the sub-blocks to be erased as denoted by SEL, during a first sub-period T41~T42 of the pre-program period PPGM, the control circuit 450 in FIG. 8 may control the voltage generator 500 and the address decoder 460 to apply the first pre-program voltage VPPGM1 to the internal word-lines WL2 and WL3 of the first sub-block SB1, the internal word-lines WL10 and WL11 of the third sub-block SB3 and the boundary word-lines WL4 and WL5, to apply the pass voltage VPASS to the boundary word-line WL1 of the first sub-block SB1 and the boundary word-line WL8 of the second sub-block SB2, and to apply the pass voltage VPASS to the word-lines WL9~WL12 of the third sub-block SB3. The third sub-block SB3 is a sub-block not to be erased as denoted by UNS.

During a second sub-period T42~T43 of the pre-program period PPGM, the control circuit 450 in FIG. 8 may control the voltage generator 500 and the address decoder 460 to apply the second pre-program voltage VPPGM2 to the boundary word-line WL1 of the first sub-block SB1 and the boundary word-line WL8 of the second sub-block SB2, to apply the pass voltage VPASS to internal word-lines WL2 and WL3 of the first sub-block SB1, the internal word-lines WL10 and WL11 of the third sub-block SB3 and the boundary word-lines WL4 and WL5 and to apply the pass voltage VPASS to the word-lines WL9~WL12 of the third sub-block SB3.

During the erase execution period ERSE between time point T43 and T45, the control circuit 450 in FIG. 8 may control the voltage generator 500 and the address decoder 460 to apply the erase voltage VRES arriving at a target level at a time point T44 to the channel CH of the cell string NS through the erase transistors ERT1 and ERT2, to apply a ground voltage VSS to the word-lines WL1~WL4 of the first sub-block SB1 and the word-lines WL5~WL8 of the second sub-block SB2 to erase memory cells coupled to the word-lines WL1~WL4 and memory cells coupled to the word-lines WL5~WL8 and float the word-lines WL9~WL12 of the third sub-block SB3.

During a first sub-period T45~T46 of the erase verification period EVFY, the control circuit 450 in FIG. 8 may control the voltage generator 500 and the address decoder 460 to apply the first erase verification voltage VEV1 to the boundary word-line WL1 of the first sub-block SB1 and the boundary word-line WL8 of the second sub-block SB2, to apply the read voltage VRD to the internal word-lines WL2 and WL3 of the first sub-block SB1, the internal word-lines WL10 and WL11 of the third sub-block SB3 and the boundary word-lines WL4 and WL5 and to apply the read voltage VRD to the word-lines WL9~WL12 of the third sub-block SB3.

During a second sub-period T46~T47 of the erase verification period EVFY, the control circuit 450 in FIG. 8 may control the voltage generator 500 and the address decoder 460 to apply the read voltage VRD to the boundary word-line WL1 of the first sub-block SB1 and to the boundary word-line WL8 of the second sub-block SB2, to apply the second erase verification voltage VEV2 to the internal word-lines WL2 and WL3 of the first sub-block SB1, the internal word-lines WL10 and WL11 of the third sub-block SB3 and the boundary word-lines WL4 and WL5 and to apply the read voltage VRD to the word-lines WL9~WL12 of the third sub-block SB3.

FIGS. 23A and 23B are diagrams of examples of sub-blocks included in a memory block on which an erase operation is performed, according to example embodiments.

Referring to FIG. 23A, a memory block BLKi_a may include first through k-th sub-block SB1, SB2, . . . , SBk (k is a natural number greater than 2). That is, the memory block BLKi_a may include three or more sub-blocks SB1, SB2, . . . , SBk. The sub-blocks SB1, SB2, . . . , SBk may be respectively coupled to the same number of word-lines, and the number of memory cells included in the sub-blocks SB1, SB2, . . . , SBk may be identical to each other. However, this is merely an example, and various embodiments may be made. For example, the number of word-lines connected to the sub-blocks SB1, SB2, . . . , SBk may be different from each other, and the number of memory cells included in the sub-blocks SB1, SB2, . . . , SBk may be different from each other. A position of each of the sub-blocks SB1, SB2, . . . , SBk may be defined with respect to the bit-line BL or the common source line CSL. For example, first to j-th sub-blocks SB1 to SBj (where, j is a natural number less than k−1) may be defined to be adjacent to the common source line CSL, and (j+1)-th to k-th sub-blocks SB (j+1) to SBk may be defined to be adjacent to the bit-line BL.

When the control circuit 450 in FIG. 8 performs an erase operation on one or more sub-blocks to be erased from among the sub-blocks SB1, SB2, . . . , SBk, the control circuit 450 may adjust a time point to float word-lines of the one or more sub-blocks to be erased based on a position of the one or more sub-blocks to be erased with respect to the bit-line BL or the common source line CSL.

Referring to FIG. 23B, a memory block BLKi_b may include the first sub-block SB1, the second sub-block SB2 and the third sub-block SB3 connected to the different numbers of word-lines. For example, the first sub-block SB1 may be connected to p word-lines WL1 to WLp, the second sub-block SB2 may be connected to q word-lines WL (p+1) to WL (p+q) and the third sub-block SB3 may be connected to r word-lines WL (p+q+1) to WL (p+q+r). For example, a ratio of the number of word-lines of the first sub-block SB1, the number of word-lines of the second sub-block SB2 and the number of word-lines of the third sub-block SB3 may vary, for example, '30:40:30', '20:40:40' and the like.

FIG. 24 illustrates an example of a plurality of erase loops performed on at least one sub-block to be erased according to some example embodiments.

Referring to FIG. 24, a plurality of erase loops ELOOP1, ELOOP2 . . . , ELOOPK may be sequentially performed, where K is a natural number greater than or equal to two. For each erase loop, one of erase operations EO1, EO2, . . . , EOK using the erase voltage VERS and a respective one of erase verification operations EV1, EV2, . . . , EVK using the erase verification voltages VEV1 and VEV2 may be sequentially performed. For the erase loop ELOOP1, a pre-program operation PPO1 using a pre-program operation PPO1 may be performed prior to the erase operation EO1.

The pre-program operation PPO1 may be performed on memory cells coupled to boundary word-lines and internal word-lines of the at least one sub-block to be erased, and a respective one of the erase verification operations EV1, EV2, . . . , EVK may be performed on the memory cells coupled to the boundary word-lines of the at least one sub-block to be erased by using the erase verification voltage VEV1 and on the memory cells coupled to the internal word-lines of the at least one sub-block to be erased by using the erase verification voltage VEV2, respectively.

A level of the erase voltage VERS in a current erase loop may be higher than that of the erase voltage VERS in a previous erase loop, and the erase verification voltages VEV1 and VEV2 may have a constant level (e.g., a first verification level VEVL1).

For example, in the first erase loop ELOOP1, the erase voltage VERS may have an initial erase level VERLI. In the second erase loop ELOOP2, the erase voltage VERS may have a level that is increased by a step level ΔVERL from the initial erase level VERLI. In the K-th erase loop ELOOPK which is the last erase loop, the erase voltage VERS may have a final erase level VERLF.

Although FIG. 24 illustrates that only the level of the erase voltage VERS increases as the erase loop is repeated, example embodiments are not limited thereto, and the level of the erase verification voltage VEVFY may also increase. In some example embodiments, the level of the erase voltage VERS may decrease and/or the level of the erase verification voltages VEV1 and VEV2 may decrease as the erase loop is repeated. In addition, although FIG. 24 illustrates that the level of the erase voltage VERS may increase by a fixed level (e.g., the step level ΔVERL), example embodiments are not limited thereto, and the amount of change in the erase voltage VERS may be changed for each erase loop.

Therefore, in the nonvolatile memory device and the method of controlling an erase operation of a nonvolatile memory device, a pre-program operation with a first bias condition may be performed on memory cells coupled to internal word-lines and boundary word-lines of at least one sub-block to be erased and/or an erase verification operation with a second bias condition may be performed on the memory cells coupled to internal word-lines and the boundary word-lines of the at least one sub-block to be erased, and thus deep erase and/or soft erase occurring to the memory cells coupled to the boundary word-lines may be prevented. Accordingly, the characteristic of the boundary word-lines may be prevented from being degraded.

FIG. 25 is a cross-sectional view of a nonvolatile memory device according to some example embodiments.

Referring to FIG. 25, a nonvolatile memory device (or a memory device) 5000 may have a chip-to-chip (C2C) structure. At least one upper chip including a cell region and a lower chip including a peripheral circuit region PREG may be manufactured separately, and then, the at least one upper chip and the lower chip may be connected to each other by a bonding method to realize the C2C structure. For example, the bonding method may mean or may include a method of electrically or physically connecting a bonding metal pattern formed in an uppermost metal layer of the upper chip to a bonding metal pattern formed in an uppermost metal layer of the lower chip. For example, in a case in which the bonding metal patterns are formed of copper (Cu), the bonding method may be a Cu—Cu bonding method. Alternatively, the bonding metal patterns may be formed of aluminum (Al) or tungsten (W).

The memory device 5000 may include the at least one upper chip including the cell region. For example, as illustrated in FIG. 25, the memory device 5000 may include two upper chips. However, the number of the upper chips is not limited thereto. In cases in which the memory device 5000 includes the two upper chips, a first upper chip including a first cell region CREG1, a second upper chip including a second cell region CREG2 and the lower chip including the peripheral circuit region PREG may be manufactured separately, and then, the first upper chip, the second upper chip and the lower chip may be connected to each other by one or more bonding methods to manufacture the memory device 5000. The first upper chip may be turned over and then may be connected to the lower chip by a bonding method, and the second upper chip may also be turned over and then may be connected to the first upper chip by a bonding method. Hereinafter, upper and lower portions of each of the first and second upper chips will be defined based on before each of the first and second upper chips is turned over, or prior to the realization of the C2C structure. In other words, an upper portion of the lower chip may mean an upper portion defined based on a +Z-axis direction, and the upper portion of each of the first and second upper chips may mean an upper portion defined based on a −Z-axis direction in FIG. 25. However, the present disclosure is not limited thereto. In certain example embodiments, one of the first upper chip and the second upper chip may be turned over and then may be connected to a corresponding chip by the bonding method.

Each of the peripheral circuit region PREG and the first and second cell regions CREG1 and CREG2 of the memory device 5000 may include an external pad bonding region PA, a word-line bonding region WLBA, and a bit-line bonding region BLBA.

The peripheral circuit region PREG may include a first substrate 5210 and a plurality of circuit elements 5220a, 5220b and 5220c formed on the first substrate 5210. An interlayer insulating layer 5215 including one or more insulating layers may be provided on the plurality of circuit elements 5220a, 5220b and 5220c, and a plurality of metal lines electrically connected to the plurality of circuit elements 5220a, 5220b and 5220c may be provided in the interlayer insulating layer 5215. For example, the plurality of metal lines may include first metal lines 5230a, 5230b and 5230c connected to the plurality of circuit elements 5220a, 5220b and 5220c, and second metal lines 5240a, 5240b and 5240c formed on the first metal lines 5230a, 5230b and 5230c. The plurality of metal lines may be formed of at least one of various conductive materials. For example, the first metal lines 5230a, 5230b and 5230c may be formed of tungsten having a relatively high electrical resistivity, and the second metal lines 5240a, 5240b and 5240c may be formed of copper having a relatively low electrical resistivity. The present disclosure is not limited thereto.

The first metal lines 5230a, 5230b and 5230c and the second metal lines 5240a, 5240b and 5240c are illustrated and described in the present embodiments. However, example embodiments are not limited thereto. In certain example embodiments, at least one or more additional metal lines may further be formed on the second metal lines 5240a, 5240b and 5240c. In this case, the second metal lines 5240a, 5240b and 5240c may be formed of aluminum, and at least some of the additional metal lines formed on the second metal lines 5240a, 5240b and 5240c may be formed of copper having an electrical resistivity lower than that of aluminum of the second metal lines 5240a, 5240b and 5240c.

The interlayer insulating layer 5215 may be on the first substrate 5210 and may include an insulating material such as silicon oxide and/or silicon nitride.

Each of the first and second cell regions CREG1 and CREG2 may include at least one memory block. The first cell region CREG1 may include a second substrate 5310 and a common source line 5320. A plurality of word-lines 5330 (e.g., word lines 5331 to 5338) may be stacked on the second substrate 5310 in a direction (i.e., the Z-axis direction) perpendicular to a top surface of the second substrate 5310. String selection lines and a ground selection line may be on and under the word-lines 5330, and the plurality of word-lines 5330 may be between the string selection lines and the ground selection line. Memory cells coupled to the plurality of word-lines 5330 may be divided into a plurality of sub-blocks SBs_a as mentioned above.

Likewise, the second cell region CREG2 may include a third substrate 5410 and a common source line 5420, and a plurality of word-lines 5430 (e.g., word lines 5431 to 5438) may be stacked on the third substrate 5410 in a direction (i.e., the Z-axis direction) perpendicular to a top surface of the third substrate 5410. Memory cells coupled to the plurality of word-lines 5430 may be divided into a plurality of sub-blocks SBs_b as mentioned above.

Each of the second substrate 5310 and the third substrate 5410 may be formed of at least one of various materials and may be, for example, a silicon substrate, a silicon-germanium substrate, a germanium substrate, or a substrate having a single-crystalline epitaxial layer grown on a single-crystalline silicon substrate. A plurality of channel structures CH may be formed in each of the first and second cell regions CREG1 and CREG2.

In some example embodiments, as illustrated in a region 'A1', the channel structure CH may be provided in the bit-line bonding region BLBA and may extend in the direction perpendicular to the top surface of the second substrate 5310 to penetrate or extend through the word-lines 5330, the string selection lines, and the ground selection line. The channel structure CH may include a data storage layer, a channel layer, and a filling insulation layer. The channel layer may be electrically connected to a first metal line 5350c and a second metal line 5360c in the bit-line bonding region BLBA. For example, the second metal line 5360c may be a bit-line and may be connected to the channel structure CH through the first metal line 5350c. The bit-line 5360c may extend in a first direction (e.g., a Y-axis direction) parallel to the top surface of the second substrate 5310.

In some example embodiments, as illustrated in a region 'A2', the channel structure CH may include a lower channel LCH and an upper channel UCH, which are connected to each other. For example, the channel structure CH may be formed by a process of forming the lower channel LCH and a process of forming the upper channel UCH. The lower channel LCH may extend in the direction perpendicular to the top surface of the second substrate 5310 to penetrate or extend through the common source line 5320 and lower word-lines 5331 and 5332. The lower channel LCH may include a data storage layer, a channel layer, and a filling insulation layer and may be connected to the upper channel UCH. The upper channel UCH may penetrate or extend through upper word-lines 5333 to 5338. The upper channel UCH may include a data storage layer, a channel layer, and a filling insulation layer, and the channel layer of the upper channel UCH may be electrically connected to the first metal line 5350c and the second metal line 5360c. As a length of a channel increases, due to characteristics of manufacturing processes, it may be difficult to form a channel having a substantially uniform width. The memory device 5000 according to some embodiments may include a channel having improved width uniformity due to the lower channel LCH and the upper channel UCH which may be formed by processes performed sequentially.

In the case in which the channel structure CH includes the lower channel LCH and the upper channel UCH as illustrated in the region 'A2', a word-line located near to a boundary between the lower channel LCH and the upper channel UCH may be a dummy word-line. For example, the word-lines 5332 and 5333 adjacent to the boundary between the lower channel LCH and the upper channel UCH may be the dummy word-lines. In this case, data may not be stored in memory cells connected to the dummy word-line. Alternatively, the number of pages corresponding to the memory cells connected to the dummy word-line may be less than the number of pages corresponding to the memory cells connected to a general word-line. A level of a voltage applied to the dummy word-line may be different from a level of a voltage applied to the general word-line, and thus it may be possible to reduce an influence of a non-uniform channel width between the lower and upper channels LCH and UCH on an operation of the memory device.

Meanwhile, the number of the lower word-lines 5331 and 5332 penetrated by the lower channel LCH may be less than the number of the upper word-lines 5333 to 5338 penetrated by the upper channel UCH in the region 'A2'. However, example embodiments are not limited thereto. In some example embodiments, the number of the lower word-lines penetrated by the lower channel LCH may be equal to or more than the number of the upper word-lines penetrated by the upper channel UCH. In addition, structural features and connection relations of the channel structure CH in the second cell region CREG2 may be substantially the same as those of the channel structure CH in the first cell region CREG1, and duplicative description thereof is omitted here in the interest of brevity.

In the bit-line bonding region BLBA, a first through-electrode THV1 may be provided in the first cell region CREG1, and a second through-electrode THV2 may be provided in the second cell region CREG2. As illustrated in FIG. 25, the first through-electrode THV1 may penetrate or extend through the common source line 5320 and the plurality of word-lines 5330. In some example embodiments, the first through-electrode THV1 may further penetrate the second substrate 5310. The first through-electrode THV1 may include a conductive material. Alternatively, the first through-electrode THV1 may include a conductive material surrounded by an insulating material. The second through-electrode THV2 may have the same shape and structure as the first through-electrode THV1.

In some embodiments, the first through-electrode THV1 and the second through-electrode THV2 may be electrically connected to each other through a first through-metal pattern 5372d and a second through-metal pattern 5472d. The first through-metal pattern 5372d may be formed at a bottom end of the first upper chip including the first cell region CREG1, and the second through-metal pattern 5472d may be formed at a top end of the second upper chip including the second cell region CREG2. The first through-electrode THV1 may be electrically connected to the first metal line 5350c and the second metal line 5360c. The second through-electrode THV2 may be electrically connected to a third metal line 5450c and a fourth metal line 5460c. A lower via 5371d may be formed between the first through-electrode THV1 and the first through-metal pattern 5372d, and an upper via 5471d may be formed between the second through-electrode THV2 and the second through-metal pattern 5472d. The first through-metal pattern 5372d and the second through-metal pattern 5472d may be connected to each other by a bonding method.

In addition, in the bit-line bonding region BLBA, an upper metal pattern 5252 may be formed in an uppermost metal layer of the peripheral circuit region PREG, and an upper metal pattern 5392 having the same shape as the upper metal pattern 5252 may be formed in an uppermost metal layer of the first cell region CREG1. The upper metal pattern 5392 of the first cell region CREG1 and the upper metal pattern 5252 of the peripheral circuit region PREG may be electrically connected to each other by a bonding method. In the bit-line bonding region BLBA, the bit-line 5360c may be electrically connected to a page buffer included in the peripheral circuit region PREG. For example, some of the circuit elements 5220c of the peripheral circuit region PREG may constitute the page buffer, and the bit-line 5360c may be electrically connected to the circuit elements 5220c constituting the page buffer through an upper bonding metal pattern 5370c of the first cell region CREG1 and an upper bonding metal pattern 5270c of the peripheral circuit region PREG.

Referring still to FIG. 25, in the word-line bonding region WLBA, the word-lines 5330 of the first cell region CREG1 may extend in a second direction (e.g., an X-axis direction) parallel to the top surface of the second substrate 5310 and may be connected to a plurality of cell contact plugs 5340 (e.g., cell contact plugs 5341 to 5347). First metal lines 5350b and second metal lines 5360b may be sequentially connected onto the cell contact plugs 5340 connected to the word-lines 5330. In the word-line bonding region WLBA, the cell contact plugs 5340 may be connected to the peripheral circuit region PREG through upper bonding metal patterns 5370b of the first cell region CREG1 and upper bonding metal patterns 5270b of the peripheral circuit region PREG.

The cell contact plugs 5340 may be electrically connected to a row decoder included in the peripheral circuit region PREG. For example, some of the circuit elements 5220b of the peripheral circuit region PREG may constitute the row decoder, and the cell contact plugs 5340 may be electrically connected to the circuit elements 5220b constituting the row decoder through the upper bonding metal patterns 5370b of the first cell region CREG1 and the upper bonding metal patterns 5270*b* of the peripheral circuit region PREG. In some embodiments, an operating voltage of the circuit elements 5220*b* constituting the row decoder may be different from an operating voltage of the circuit elements 5220*c* constituting the page buffer. For example, the operating voltage of the circuit elements 5220*c* constituting the page buffer may be greater than the operating voltage of the circuit elements 5220*b* constituting the row decoder.

Likewise, in the word-line bonding region WLBA, the word-lines 5430 of the second cell region CREG2 may extend in the second direction (e.g., the X-axis direction) parallel to the top surface of the third substrate 5410 and may be connected to a plurality of cell contact plugs 5440 (e.g., cell contact plugs 5441 to 5447). The cell contact plugs 5440 may be connected to the peripheral circuit region PREG through an upper metal pattern of the second cell region CREG2 and lower and upper metal patterns and a cell contact plug 5348 of the first cell region CREG1.

In the word-line bonding region WLBA, the upper bonding metal patterns 5370*b* may be formed in the first cell region CREG1, and the upper bonding metal patterns 5270*b* may be formed in the peripheral circuit region PREG. The upper bonding metal patterns 5370*b* of the first cell region CREG1 and the upper bonding metal patterns 5270*b* of the peripheral circuit region PREG may be electrically connected to each other by the bonding method. The upper bonding metal patterns 5370*b* and the upper bonding metal patterns 5270*b* may be formed of aluminum, copper, or tungsten, as non-limiting examples.

In the external pad bonding region PA, a lower metal pattern 5371*e* may be formed in a lower portion of the first cell region CREG1, and an upper metal pattern 5472*a* may be formed in an upper portion of the second cell region CREG2. The lower metal pattern 5371*e* of the first cell region CREG1 and the upper metal pattern 5472*a* of the second cell region CREG2 may be connected to each other in the external pad bonding region PA by a bonding method. Likewise, an upper metal pattern 5372*a* may be formed in an upper portion of the first cell region CREG1, and an upper metal pattern 5272*a* may be formed in an upper portion of the peripheral circuit region PREG. The upper metal pattern 5372*a* of the first cell region CREG1 and the upper metal pattern 5272*a* of the peripheral circuit region PREG may be connected to each other by a bonding method.

Common source line contact plugs 5380 and 5480 may be in the external pad bonding region PA. The common source line contact plugs 5380 and 5480 may be formed of a conductive material, such as a metal, a metal compound, and/or doped polysilicon. The common source line contact plug 5380 of the first cell region CREG1 may be electrically connected to the common source line 5320, and the common source line contact plug 5480 of the second cell region CREG2 may be electrically connected to the common source line 5420. A first metal line 5350*a* and a second metal line 5360*a* may be sequentially stacked on the common source line contact plug 5380 of the first cell region CREG1, and a first metal line 5450*a* and a second metal line 5460*a* may be sequentially stacked on the common source line contact plug 5480 of the second cell region CREG2.

Input/output pads 5205, 5405 and 5406 may be in the external pad bonding region PA. Referring to FIG. 25, a lower insulating layer 5201 may cover a bottom surface of the first substrate 5210, and a first input/output pad 5205 may be formed on the lower insulating layer 5201. The first input/output pad 5205 may be connected to at least one of a plurality of the circuit elements 5220*a* in the peripheral circuit region PREG through a first input/output contact plug 5203 and may be separated from the first substrate 5210 by the lower insulating layer 5201. In addition, a side insulating layer may be between the first input/output contact plug 5203 and the first substrate 5210 to electrically isolate the first input/output contact plug 5203 from the first substrate 5210.

An upper insulating layer 5401 covering a top surface of the third substrate 5410 may be formed on the third substrate 5410. A second input/output pad 5405 and/or a third input/output pad 5406 may be on the upper insulating layer 5401. The second input/output pad 5405 may be connected to at least one of the plurality of circuit elements 5220*a* in the peripheral circuit region PREG through second input/output contact plugs 5403 and 5303, and the third input/output pad 5406 may be connected to at least one of the plurality of circuit elements 5220*a* in the peripheral circuit region PREG through third input/output contact plugs 5404 and 5304.

In some example embodiments, the third substrate 5410 may not be provided in a region in which the input/output contact plug is arranged. For example, as illustrated in a region 'B', the third input/output contact plug 5404 may be separated from the third substrate 5410 in a direction parallel to the top surface of the third substrate 5410 and may penetrate or extend through an interlayer insulating layer 5415 of the second cell region CREG2 so as to be connected to the third input/output pad 5406. In this case, the third input/output contact plug 5404 may be formed by at least one of various processes.

In some example embodiments, as illustrated in a region 'B1', the third input/output contact plug 5404 may extend in a third direction (e.g., the Z-axis direction), and a diameter of the third input/output contact plug 5404 may become progressively greater toward the upper insulating layer 5401. In other words, a diameter of the channel structure CH described in the region 'A1' may become progressively less toward the upper insulating layer 5401, but the diameter of the third input/output contact plug 5404 may become progressively greater toward the upper insulating layer 5401. For example, the third input/output contact plug 5404 may be formed after the second cell region CREG2 and the first cell region CREG1 are bonded to each other by the bonding method.

In some example embodiments, as illustrated in a region 'B2', the third input/output contact plug 5404 may extend in the third direction (e.g., the Z-axis direction), and a diameter of the third input/output contact plug 5404 may become progressively less toward the upper insulating layer 5401. In other words, like the channel structure CH, the diameter of the third input/output contact plug 5404 may become progressively less toward the upper insulating layer 5401. For example, the third input/output contact plug 5404 may be formed together with the cell contact plugs 5440 before the second cell region CREG2 and the first cell region CREG1 are bonded to each other.

In some example embodiments, the input/output contact plug may overlap with the third substrate 5410. For example, as illustrated in a region 'C', the second input/output contact plug 5403 may penetrate or extend through the interlayer insulating layer 5415 of the second cell region CREG2 in the third direction (e.g., the Z-axis direction) and may be electrically connected to the second input/output pad 5405 through the third substrate 5410. In this case, a connection structure of the second input/output contact plug 5403 and the second input/output pad 5405 may be realized by various methods.

In some example embodiments, as illustrated in a region 'C1', an opening 5408 may be formed to penetrate or extend through the third substrate 5410, and the second input/output contact plug 5403 may be connected directly to the second input/output pad 5405 through the opening 5408 formed in the third substrate 5410. In this case, as illustrated in the region 'C1', a diameter of the second input/output contact plug 5403 may become progressively greater toward the second input/output pad 5405. However, example embodiments are not limited thereto, and in some example embodiments, the diameter of the second input/output contact plug 5403 may become progressively less toward the second input/output pad 5405.

In some example embodiments, as illustrated in a region 'C2', the opening 5408 penetrating or extending through the third substrate 5410 may be formed, and a contact 5407 may be formed in the opening 5408. An end of the contact 5407 may be connected to the second input/output pad 5405, and another end of the contact 5407 may be connected to the second input/output contact plug 5403. Thus, the second input/output contact plug 5403 may be electrically connected to the second input/output pad 5405 through the contact 5407 in the opening 5408. In this case, as illustrated in the region 'C2', a diameter of the contact 5407 may become progressively greater toward the second input/output pad 5405, and a diameter of the second input/output contact plug 5403 may become progressively less toward the second input/output pad 5405. For example, the second input/output contact plug 5403 may be formed together with the cell contact plugs 5440 before the second cell region CREG2 and the first cell region CREG1 are bonded to each other, and the contact 5407 may be formed after the second cell region CREG2 and the first cell region CREG1 are bonded to each other.

In some example embodiments illustrated in a region 'C3', a stopper 5409 may further be formed on a bottom end of the opening 5408 of the third substrate 5410, as compared with the embodiments of the region 'C2'. The stopper 5409 may be a metal line formed in the same layer as the common source line 5420. Alternatively, the stopper 5409 may be a metal line formed in the same layer as at least one of the word-lines 5430. The second input/output contact plug 5403 may be electrically connected to the second input/output pad 5405 through the contact 5407 and the stopper 5409.

Like the second and third input/output contact plugs 5403 and 5404 of the second cell region CREG2, a diameter of each of the second and third input/output contact plugs 5303 and 5304 of the first cell region CREG1 may become progressively less toward the lower metal pattern 5371e or may become progressively greater toward the lower metal pattern 5371e.

Meanwhile, in some example embodiments, a slit 5411 may be formed in the third substrate 5410. For example, the slit 5411 may be formed at a certain position of the external pad bonding region PA. For example, as illustrated in a region 'D', the slit 5411 may be located between the second input/output pad 5405 and the cell contact plugs 5440 when viewed in a plan view. In some embodiments, the second input/output pad 5405 may be located between the slit 5411 and the cell contact plugs 5440 when viewed in a plan view.

In some embodiments, as illustrated in a region 'D1', the slit 5411 may be formed to penetrate or extend through the third substrate 5410. For example, the slit 5411 may be used to prevent or reduce the third substrate 5410 from being finely cracked when the opening 5408 is formed. However, the present disclosure is not limited thereto, and in certain example embodiments, the slit 5411 may be formed to have a depth ranging from about 60% to about 70% of a thickness of the third substrate 5410.

In some example embodiments, as illustrated in a region 'D2', a conductive material 5412 may be formed in the slit 5411. For example, the conductive material 5412 may be used to discharge a leakage current that may occur in driving of the circuit elements in the external pad bonding region PA to the outside. In this case, the conductive material 5412 may be connected to an external ground line.

In certain example embodiments, as illustrated in a region 'D3', an insulating material 5413 may be formed in the slit 5411. For example, the insulating material 5413 may be used to electrically isolate the second input/output pad 5405 and the second input/output contact plug 5403 arranged in the external pad bonding region PA from the word-line bonding region WLBA. Since the insulating material 5413 is formed in the slit 5411, it is possible to prevent or reduce a voltage provided through the second input/output pad 5405 from affecting a metal layer on the third substrate 5410 in the word-line bonding region WLBA.

In some example embodiments, the first to third input/output pads 5205, 5405 and 5406 may be selectively formed. For example, the memory device 5000 may be realized to include only the first input/output pad 5205 on the first substrate 5210, to include only the second input/output pad 5405 on the third substrate 5410, or to include only the third input/output pad 5406 on the upper insulating layer 5401.

In some example embodiments, at least one of the second substrate 5310 of the first cell region CREG1 and the third substrate 5410 of the second cell region CREG2 may be used as a sacrificial substrate and may be completely or partially removed before or after a bonding process. An additional layer may be stacked after the removal of the substrate. For example, the second substrate 5310 of the first cell region CREG1 may be removed before or after the bonding process of the peripheral circuit region PREG and the first cell region CREG1, and then, an insulating layer covering a top surface of the common source line 5320 or a conductive layer for connection may be formed. Likewise, the third substrate 5410 of the second cell region CREG2 may be removed before or after the bonding process of the first cell region CREG1 and the second cell region CREG2, and then, the upper insulating layer 5401 covering a top surface of the common source line 5420 or a conductive layer for connection may be formed.

FIG. 26 is a diagram illustrating a manufacturing process of a stacked semiconductor device according to some example embodiments.

Referring to FIG. 26, respective integrated circuits may be formed on a first wafer WF1 and a second wafer WF2. The memory cell array may be formed in the first wafer WF1, and the peripheral circuits may be formed in the second wafer WF2. A diameter of either of the first wafer WF1 or the second wafer WF2 may be, for example, 200 mm, or 300 mm, or 450 mm, but the present disclosure is not limited thereto. The diameter of the first wafer WF1 may be the same as, or different from (e.g., smaller than or bigger than) a diameter of the second wafer WF2. A number of die on the first wafer WF1 may be the same as, or different from (e.g., more than or less than) a number of die on the second wafer WF2. Die on the first wafer WF1 may be aligned and positioned the same as die on the second wafer WF2; however, the present disclosure is not limited thereto. Either or both of the first wafer WF1 and the second wafer WF2 may be doped, e.g., lightly doped with impurities such as boron and/or phosphorus and/or arsenic; in some embodiments, at least one of the first wafer WF1 and the second wafer WF2 may be undoped.

FIG. 27 is a block diagram illustrating an electronic system including a semiconductor device according to some example embodiments.

Referring to FIG. 27, an electronic system 3000 may include a semiconductor device 3100 and a controller 3200 electrically connected to the semiconductor device 3100. The electronic system 3000 may be a storage device including one or a plurality of semiconductor devices 3100 or an electronic device including a storage device. For example, the electronic system 3000 may be a solid state drive (SSD) device, a universal serial bus (USB), a computing system, a medical device, or a communication device that may include one or a plurality of semiconductor devices 3100.

The semiconductor device 3100 may be or may include a non-volatile memory device, for example, a nonvolatile memory device that is illustrated with reference to FIGS. 5 to 23B and 26. The semiconductor device 3100 may include a first structure 3100F and a second structure 3100S on the first structure 3100F. The first structure 3100F may be a peripheral circuit structure including a decoder circuit 3110, a page buffer circuit (PBC) 3120, and a logic circuit 3130. The second structure 3100S may be a memory cell structure including a bit-line BL, a common source line CSL, word-lines WL, first and second upper gate lines UL1 and UL2, first and second lower gate lines LL1 and LL2, and memory cell strings CSTR between the bit line BL and the common source line CSL.

In the second structure 3100S, each of the memory cell strings CSTR may include lower transistors LT1 and LT2 adjacent to the common source line CSL, upper transistors UT1 and UT2 adjacent to the bit-line BL, and a plurality of memory cell transistors MCT between the lower transistors LT1 and LT2 and the upper transistors UT1 and UT2. The number of the lower transistors LT1 and LT2 and the number of the upper transistors UT1 and UT2 may be varied in accordance with various examples of embodiments.

In some example embodiments, the upper transistors UT1 and UT2 may include string selection transistors, and the lower transistors LT1 and LT2 may include ground selection transistors. The lower gate lines LL1 and LL2 may be gate electrodes of the lower transistors LT1 and LT2, respectively. The word lines WL may be gate electrodes of the memory cell transistors MCT, respectively, and the upper gate lines UL1 and UL2 may be gate electrodes of the upper transistors UT1 and UT2, respectively.

In some example embodiments, the lower transistors LT1 and LT2 may include a lower erase control transistor LT1 and a ground selection transistor LT2 that may be connected with each other in serial. The upper transistors UT1 and UT2 may include a string selection transistor UT1 and an upper erase control transistor UT2 that may be connected with each other in serial. At least one of the lower erase control transistor LT1 and the upper erase control transistor UT2 may be used in an erase operation for erasing data stored in the memory cell transistors MCT through gate induced drain leakage (GIDL) phenomenon.

The common source line CSL, the first and second lower gate lines LL1 and LL2, the word lines WL, and the first and second upper gate lines UL1 and UL2 may be electrically connected to the decoder circuit 3110 through first connection wirings 3115 extending to the second structure 3110S from the first structure 3100F. The bit-lines BL may be electrically connected to the page buffer circuit 3120 through second connection wirings 3125 extending to the second structure 3100S from the first structure 3100F.

In the first structure 3100F, the decoder circuit 3110 and the page buffer circuit 3120 may perform a control operation for at least one selected memory cell transistor among the plurality of memory cell transistors MCT. The decoder circuit 3110 and the page buffer circuit 3120 may be controlled by the logic circuit 3130. The semiconductor device 3100 may communicate with the controller 3200 through an input/output pad 3101 electrically connected to the logic circuit 3130. The input/output pad 3101 may be electrically connected to the logic circuit 3130 through an input/output connection wiring 3135 extending to the second structure 3100S from the first structure 3100F.

The controller 3200 may include a processor 3210, a NAND controller 3220, and a host interface (I/F) 3230. The electronic system 3000 may include a plurality of semiconductor devices 3100, and in this case, the controller 3200 may control the plurality of semiconductor devices 3100.

The processor 3210 may control operations of the electronic system 3000 including the controller 3200. The processor 3210 may be operated by firmware, and may control the NAND controller 3220 to access the semiconductor device 3100. The NAND controller 3220 may include a NAND interface 3221 for communicating with the semiconductor device 3100. Through the NAND interface 3221, control commands for controlling the semiconductor device 3100, data to be written in the memory cell transistors MCT of the semiconductor device 3100, data read from the memory cell transistors MCT of the semiconductor device 3100, etc., may be transferred. The host interface 3230 may provide communication between the electronic system 3000 and an outside host. When a control command is received from the outside host through the host interface 3230, the processor 3210 may control the semiconductor device 3100 in response to the control command.

A nonvolatile memory device or a storage device according to example embodiments may be packaged using various package types or package configurations.

The example embodiments may be applied to various electronic devices including nonvolatile memory devices. For example, the example embodiments may be applied to systems, such as a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, or the like.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present disclosure as defined by the claims.

What is claimed is:

1. A nonvolatile memory device comprising:
   at least one memory block including a plurality of cell strings, each of the plurality of cell strings including: a string selection transistor, a plurality of memory cells and a ground selection transistor which are connected in series and arranged in a vertical direction between a bit-line and a common source line, wherein the at least one memory block is divided into a plurality of sub-blocks arranged in the vertical direction, and wherein each of the plurality of sub-blocks includes at least one boundary word-line adjacent to another sub-block of the plurality of sub-blocks and internal word-lines different from the at least one boundary word-line; and a control circuit configured to control an erase operation by:

applying a pre-program voltage with a first individual bias condition sequentially to the internal word-lines and the at least one boundary word-line of at least one sub-block to be erased from among the plurality of sub-blocks during a pre-program period of an erase loop, wherein the internal word-lines and the at least one boundary word-line are coupled to multi-level memory cells of the plurality of memory cells, which are configured to store data; and applying an erase voltage to a channel of the at least one memory block during an erase execution period of the erase loop.

2. The nonvolatile memory device of claim 1, further comprising:

a voltage generator configured to generate, based on a control signal, word-line voltages including the pre-program voltage and the erase voltage; and an address decoder configured to provide the word-line voltages to the at least one memory block based on a row address, and wherein the control circuit is configured to control the voltage generator and the address decoder based on a command and an address including the row address.

3. The nonvolatile memory device of claim 2, wherein the control circuit is configured to control the voltage generator and the address decoder to:

during a first sub-period of the pre-program period:

apply a first pre-program voltage to the internal word-lines of the at least one sub-block to be erased; and apply a pass voltage to word-lines of at least one sub-block not to be erased from among the plurality of sub-blocks, and during a second sub-period of the pre-program period:

apply a second pre-program voltage to the at least one boundary word-line of the at least one sub-block to be erased; and apply the pass voltage to the word-lines of the at least one sub-block not to be erased.

4. The nonvolatile memory device of claim 3, wherein the control circuit is further configured to control the voltage generator and the address decoder to:

apply the first pre-program voltage during the first sub-period; and apply the second pre-program voltage during the second sub-period, the second sub-period having a time interval different from a time interval of the first sub-period.

5. The nonvolatile memory device of claim 3, wherein the control circuit is further configured to control the voltage generator and the address decoder to:

apply the first pre-program voltage during the first sub-period; and apply the second pre-program voltage during the second sub-period, the second pre-program voltage having a voltage level that is different from a voltage level of the first pre-program voltage.

6. The nonvolatile memory device of claim 3, wherein the control circuit is further configured to control the voltage generator and the address decoder to:

apply a word-line erase voltage to the internal word-lines and the at least one boundary word-line of the at least one sub-block to be erased during the erase execution period; and float the word-lines of the at least one sub-block not to be erased.

7. The nonvolatile memory device of claim 2, wherein the control circuit is further configured to control the erase operation by:

applying an erase verification voltage with a second individual bias condition sequentially to the internal word-lines and the at least one boundary word-line of the at least one sub-block to be erased during an erase verification period of the erase loop successive to the erase execution period.

8. The nonvolatile memory device of claim 7, wherein the word-line voltages further include the erase verification voltage; and wherein the control circuit is further configured to control the voltage generator and the address decoder to:

apply a first erase verification voltage to the at least one boundary word-line of the at least one sub-block to be erased during a first sub-period of the erase verification period;

apply a second erase verification voltage to the internal word-lines of the at least one sub-block to be erased during a second sub-period of the erase verification period; and apply a read voltage to the word-lines of at least one sub-block not to be erased from among a plurality of sub-blocks during each of the first sub-period and the second sub-period.

9. The nonvolatile memory device of claim 8, wherein the control circuit is further configured to control the voltage generator and the address decoder to:

apply the first erase verification voltage during the first sub-period; and apply the second erase verification voltage during the second sub-period, the second sub-period having a time interval different from a time interval of the first sub-period.

10. The nonvolatile memory device of claim 8, wherein the control circuit is further configured to control the voltage generator and the address decoder to:

apply the first erase verification voltage during the first sub-period; and apply the second erase verification voltage during the second sub-period, the second sub-period having a voltage level different from a voltage level of the first erase verification voltage.

11. The nonvolatile memory device of claim 2, wherein the plurality of sub-blocks include a first sub-block, a second sub-block and a third sub-block stacked in the vertical direction from the common source line, and wherein the control circuit is further configured to select one of the first sub-block, the second sub-block and the third sub-block as the at least one sub-block to be erased.

12. The nonvolatile memory device of claim 2, wherein the plurality of sub-blocks include a first sub-block, a second sub-block and a third sub-block stacked in the vertical direction from the common source line, and wherein the control circuit is configured to select the first sub-block and the third sub-block that are not adjacent to each other as the at least one sub-block to be erased.

13. The nonvolatile memory device of claim 12, wherein the control circuit is configured to control the voltage generator and the address decoder to:

during a first sub-period of the pre-program period:

apply a first pre-program voltage to boundary word-lines of each of the first sub-block and the third sub-block; and apply a pass voltage to word-lines of the second sub-block, during a second sub-period of the pre-program period:

apply a second pre-program voltage to internal word-lines of each of the first sub-block and the third sub-block; and apply the pass voltage to the word-lines of the second sub-block, and during the erase execution period:

apply a word-line erase voltage to the boundary word-lines and the internal word-lines of each of the first sub-block and the third sub-block; and float the word-lines of the second sub-block.

14. The nonvolatile memory device of claim 12, wherein the control circuit is further configured to control the voltage generator and the address decoder to:

during a first sub-period of an erase verification period of the erase loop successive to the erase execution period:

apply a first erase verification voltage to first and second boundary word-lines of each of the first sub-block and the third sub-block;

apply a read voltage to internal word-lines of each of the first sub-block and the third sub-block; and apply the read voltage to word-lines of the second sub-block, and during a second sub-period of the erase verification period of the erase loop:

apply a second erase verification voltage to the internal word-lines of each of the first sub-block and the third sub-block;

apply the read voltage to the first and second boundary word-lines of each of the first sub-block and the third sub-block; and apply the read voltage to the word-lines of the second sub-block.

15. The nonvolatile memory device of claim 2, wherein the plurality of sub-blocks include a first sub-block, a second sub-block and a third sub-block stacked in the vertical direction from the common source line, and wherein the control circuit is configured to select the first sub-block and the second sub-block that are adjacent to each other as the at least one sub-block to be erased.

16. The nonvolatile memory device of claim 15, wherein the control circuit is further configured to control the voltage generator and the address decoder to:

during a first sub-period of the pre-program period:

apply a first pre-program voltage to internal word-lines and non-adjacent boundary word-lines of each of the first sub-block and the second sub-block; and apply a pass voltage to word-lines of the third sub-block, during a second sub-period of the pre-program period:

apply a second pre-program voltage to the non-adjacent boundary word-lines of each of the first sub-block and the second sub-block; and apply the pass voltage to the word-lines of the third sub-block and adjacent boundary word-lines of each of the first sub-block and the second sub-block; and during the erase execution period:

apply a word-line erase voltage to boundary word-lines and the internal word-lines of each of the first sub-block and the second sub-block; and float the word-lines of the third sub-block.

17. The nonvolatile memory device of claim 15, wherein the control circuit is further configured to control the voltage generator and the address decoder to:

during a first sub-period of an erase verification period of the erase loop successive to the erase execution period:

apply a first erase verification voltage to non-adjacent boundary word-lines of each of the first sub-block and the second sub-block;

apply a read voltage to internal word-lines and adjacent boundary word-lines of each of the first sub-block and the second sub-block; and apply the read voltage to word-lines of the third sub-block, and during a second sub-period of the erase verification period of the erase loop:

apply a second erase verification voltage to the internal word-lines and the non-adjacent word-lines of each of the first sub-block and the second sub-block;

apply the read voltage to the adjacent boundary word-lines of each of the first sub-block and the second sub-block; and apply the read voltage to the word-lines of the third sub-block.

18. A method of controlling an erase operation of a nonvolatile memory device, the method comprising:

dividing at least one memory block including a plurality of cell strings into a plurality of sub-blocks arranged in a vertical direction, each of the plurality of cell strings including: a string selection transistor, a plurality of memory cells and a ground selection transistor which are connected in series and arranged in the vertical direction between a bit-line and a common source line, wherein each of the plurality of sub-blocks includes at least one boundary word-line that is adjacent to another sub-block of the plurality of sub-blocks, and wherein each of the plurality of sub-blocks includes internal word-lines different from the at least one boundary word-line;

applying a pre-program voltage with a first individual bias condition sequentially to the internal word-lines and the at least one boundary word-line of at least one sub-block to be erased from among the plurality of sub-blocks during a pre-program period of an erase loop, wherein the internal word-lines and the at least one boundary word-line are coupled to multi-level memory cells of the plurality of memory cells, which are configured to store data; and applying an erase voltage to a channel of the at least one memory block during an erase execution period of the erase loop.

19. The method of claim 18, further comprising:

applying an erase verification voltage with a second individual bias condition sequentially to the internal word-lines and the at least one boundary word-line of the at least one sub-block to be erased during an erase verification period of the erase loop successive to the erase execution period.

20. A nonvolatile memory device comprising:

at least one memory block including a plurality of cell strings, each of the plurality of cell strings including: a string selection transistor, a plurality of memory cells and a ground selection transistor which are connected in series and arranged in a vertical direction between a source line and a bit-line, wherein the at least one memory block is divided into a plurality of sub-blocks arranged in the vertical direction, with each of the plurality of sub-blocks including at least one boundary word-line that is adjacent to another sub-block and each of the plurality of sub-blocks including internal word-lines different from the at least one boundary word-line; and a control circuit configured to control an erase operation by:

applying a pre-program voltage to word-lines of at least one sub-block to be erased from among the plurality of sub-blocks during a pre-program period of an erase loop, wherein the word-lines of the at least one sub-block are coupled to multi-level memory cells of the plurality of memory cells, which are configured to store data;

applying an erase voltage to a channel of the at least one memory block during an erase execution period of the erase loop; and applying an erase verification voltage to at least one boundary word-line of the at least one sub-block to be erased during an erase verification period of the erase loop.

\* \* \* \* \*